United States Patent [19]

Mizutani et al.

[11] Patent Number: 5,751,403
[45] Date of Patent: May 12, 1998

[54] PROJECTION EXPOSURE APPARATUS AND METHOD

[75] Inventors: Hideo Mizutani, Yokohama; Tohru Kawaguchi, Kawasaki, both of Japan

[73] Assignee: Nikon Corporation, Japan

[21] Appl. No.: 471,928

[22] Filed: Jun. 6, 1995

[30] Foreign Application Priority Data

Jun. 9, 1994 [JP] Japan ................... 6-127481
Feb. 9, 1995 [JP] Japan ................... 7-021454

[51] Int. Cl.$^6$ .............. G03B 27/42; G01B 11/26
[52] U.S. Cl. .................... 355/53; 356/401
[58] Field of Search ............. 355/53; 250/548; 356/400, 401

[56] References Cited

U.S. PATENT DOCUMENTS

| | | | |
|---|---|---|---|
| 4,697,087 | 9/1987 | Wu | 356/401 X |
| 4,980,718 | 12/1990 | Salter et al. | 355/53 |
| 5,004,348 | 4/1991 | Magome | 356/401 |
| 5,204,535 | 4/1993 | Mizutani | 250/548 |
| 5,464,715 | 11/1995 | Nishi et al. | 430/22 |
| 5,489,986 | 2/1996 | Magome et al. | 356/401 |
| 5,506,684 | 4/1996 | Ota et al. | 356/401 |
| 5,568,257 | 10/1996 | Ota et al. | 356/401 X |
| 5,583,609 | 12/1996 | Mizutani et al. | 356/401 X |

FOREIGN PATENT DOCUMENTS 63-283129A 11/1988 Japan.
2-227602A 9/1990 Japan.

*Primary Examiner*—Fred L. Braun
*Attorney, Agent, or Firm*—Pennie & Edmonds LLP

[57] ABSTRACT

In the projection exposure apparatus, the alignment mechanism comprises first and second light-sending systems for sending first and second light beams through a projection optical system to the wafer and sending third and fourth light beams to the reticle, a first scanning system for scanning the first and second light beams along first and second scan straight lines included in the surface of wafer, respectively, and setting the first and second scan straight lines in axis symmetry with respect to a reference straight line passing an intersecting point between the first and second scan lines and an intersecting point between the surface of wafer and the optical axis of projection optical system, a second scanning system for scanning the third and fourth light beams along third and fourth scan straight lines included in the surface of reticle, respectively, and first and second light-receiving systems for detecting reflected light of the first and third light beams emergent from the respective surfaces of wafer and reticle, respectively, and detecting reflected light of the second and fourth light beams emergent from the respective surfaces of wafer and reticle, respectively.

51 Claims, 18 Drawing Sheets

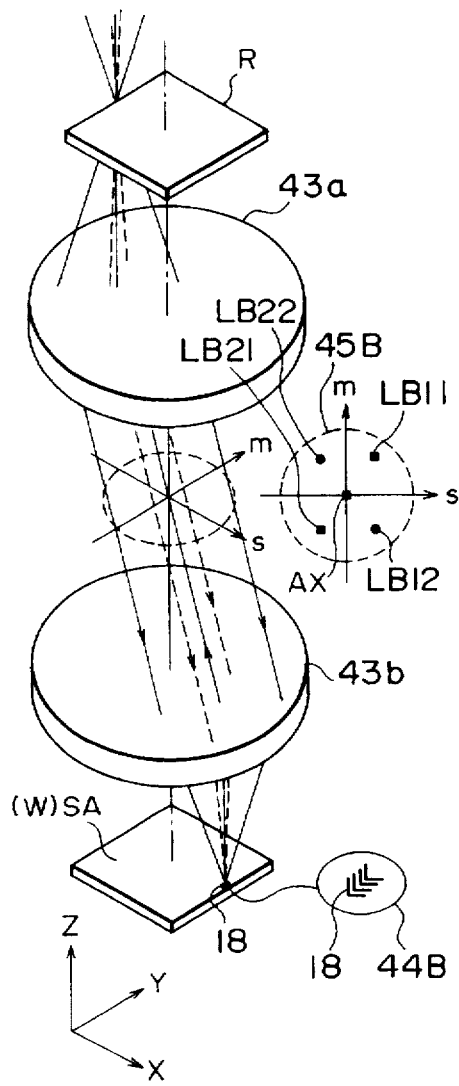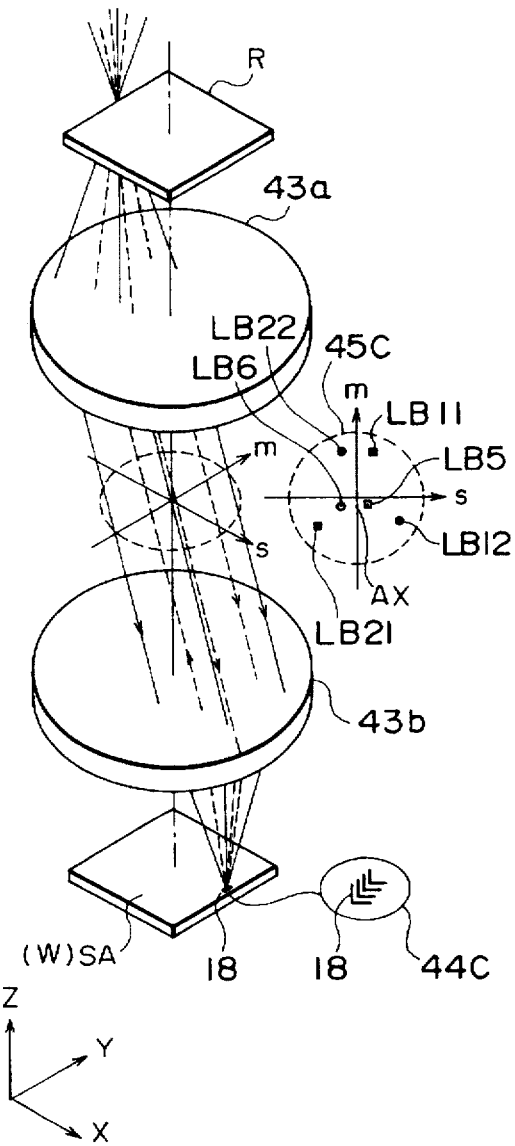

PROJECTION EXPOSURE APPARATUS AND METHOD

BACKGROUND OF THE INVENTION

1. Field of the Invention

The present invention relates to projection exposure apparatus, for example used in fabricating semiconductor devices, liquid crystal display devices, etc. by the photolithography process, which are suitable for applications as steppers of the one-shot exposure method and also suitable for applications as mask aligners of the scanning exposure method. More particularly, the present invention relates to projection exposure apparatus provided with an alignment mechanism for aligning a reticle having a photomask pattern formed thereon with a wafer coated with a photosensitive agent.

2. Related Background Art

The projection exposure apparatus have been used in fabricating semiconductor devices, liquid crystal display devices, or thin-film magnetic heads, etc. by the photolithography process. The projection exposure apparatus are arranged to transfer a photomask pattern such as a circuit pattern formed on a photomask or reticle, etc. (hereinafter referred to generally as "reticle") onto a substrate, wafer, or glass plate, etc. (hereinafter referred to generally as "wafer") coated with a photosensitive agent such as a photoresist.

In these years, because circuit patterns for semiconductor devices etc. are becoming finer and finer, there is a demand to enhance the resolving power of projection optical system. To meet such a demand, there are techniques to shorten the wavelength of exposure light or to increase the numerical aperture of projection optical system. However, even in case of either technique being employed, if an exposure field of projection optical system is kept in the same level as those heretofore, it is becoming difficult to maintain image-forming performance (distortion, curvature of field, etc.) at certain accuracy over the entire exposure field. Thus, the projection exposure apparatus of the scanning exposure method such as the so-called slit-scan method or step-and-scan method, recently come to draw more attention rather than the projection exposure apparatus of the one-shot exposure method.

In the projection exposure apparatus of the scanning exposure method, the reticle is moved in a predetermined direction with respect to an illumination area of a rectangular shape, an arcuate shape, or a plurality of trapezoid shapes arranged in a two-dimensional array (hereinafter referred to generally as "slit illumination area"), and the wafer is also moved in synchronization with the movement of reticle in a direction conjugate with the moving direction of reticle with respect to an exposure area conjugate with the slit illumination area through the projection optical system. This can effect successive exposure of the photomask pattern of reticle in each shot area on the wafer. Assuming that exposure is made with a photomask pattern of a same area, the exposure field of projection optical system is smaller in the scanning exposure method of the so-called mask aligner type than that in the one-shot exposure method of the so-called stepper type, and an improvement in the image-forming performance can be expected in the exposure field accordingly.

Additionally, since the circuit patterns for semiconductor devices etc. are becoming larger and larger in area, it is becoming difficult to apply the conventional projection exposure apparatus which have been designed as leading apparatus to have a projection magnification of projection optical system being ⅕ and to be suitable for the reticle size of 6 inches. It is thus necessary to design a projection exposure apparatus having a changed projection magnification of projection optical system, for example, of ¼. Therefore, the projection exposure apparatus of the scanning exposure method as described above are also advantageous to meet such an increase in area of transferred pattern.

Generally, in order to form semiconductor devices etc. by building up a multiplicity of circuit pattern layers on the wafer, it is necessary to maintain high registration accuracy between an already-formed circuit pattern on the wafer and a next-exposing circuit pattern on the reticle. Then, the ordinary projection exposure apparatus are provided with an alignment mechanism for optically and automatically performing positioning between the pattern area of reticle and the shot area on the wafer. The above-described projection exposure apparatus of the scanning exposure method also need the alignment mechanism.

There are a variety of methods for such an alignment mechanism, among which the so-called TTR (Through The Reticle) method is conventionally known as a high-accuracy method in particular. Here, the alignment mechanism of the TTR method is located above the reticle in such an arrangement as to simultaneously detect through a projection optical system an alignment mark for positioning, formed in a peripheral portion around the pattern area of reticle, (hereinafter referred to as "reticle mark") and an alignment mark for positioning, formed in a peripheral portion around each shot area on the wafer, (hereinafter referred to as "wafer mark"). Namely, this alignment mechanism is arranged to position the reticle with respect to the wafer by measuring an amount of relative positional deviation between the reticle mark and the wafer mark and finely adjusting movement or rotation of at least one of the reticle and wafer so that the positional deviation amount satisfies a specific relation.

Examples of the projection exposure apparatus of the scanning exposure method provided with the alignment mechanism of the TTR method are disclosed in publications of Japanese Laid-open Patent Applications No. 63-41023 and No. 4-307720. In these alignment mechanisms, wafer marks are formed along the moving direction near the both side edges of each shot area on the wafer. Also, reticle marks corresponding to the wafer marks through the projection optical system are formed near the both side edges of the pattern area of reticle. Then, before exposure or during exposure, two-dimensional positioning is carried out on occasion between the reticle and the wafer, based on an amount of relative positional deviation between two alignment marks, which is measured by detecting alignment light beams applied to the wafer mark and to the reticle mark, respectively.

Describing in more detail, in the above-described publication of Japanese Laid-open Patent Application No. 63-41023, a plurality of wafer marks disposed near the both side edges of shot area, respectively, arranged in axis symmetry with respect to the center line of shot area extending along the moving direction. These wafer marks are composed of a combination of two types of linear patterns inclined at respective angles ±45° with respect to the moving direction. Here, the exposure area on the wafer is curved in an arcuate shape, and the optical axis of projection optical system is located outside the exposure area. Thus, with respect to a straight line passing the center of either one of the wafer marks covered by the both edge parts of the exposure area and an intersecting point between the surface of wafer and the optical axis of projection optical system, the two types of linear patterns composing the wafer marks are located as inclined at mutually different angles.

In the above-described publication of Japanese Laid-open Patent Application No. 4-307720, two columns of wafer marks disposed near the both side edges of shot area, respectively, arranged in axis symmetry with respect to the center line of shot area extending along the moving direction. These two columns of wafer marks are composed of a combination of two types of linear patterns arranged each at a constant pitch along the moving direction and along the direction perpendicular thereto. Here, the exposure area on the wafer extends in a rectangular shape, and the optical axis of projection optical system is located inside the exposure area. Thus, the two types of linear patterns composing the wafer marks are arranged as parallel or perpendicular to a straight line passing the center of either one of the wafer marks covered by the both edge parts of the exposure area and an intersecting point between the surface of wafer and the optical axis of projection optical system.

There are a variety of types for such an alignment mechanism of the TTR method, among which the so-called LIA (Laser Interferometric Alignment) type is conventionally known as a high-accuracy type in particular. Here, the alignment mechanism of the LIA type employs alignment marks formed in a diffraction grating pattern (hereinafter referred to generally as "diffraction grating mark") as the reticle mark and the wafer mark, and is arranged to apply two light beams such as coherent laser beams of a different wavelength from that of exposure light to the diffraction grating marks in two different directions and to detect a phase change of diffracted light emergent corresponding to one-dimensional interference fringes flowing on the diffraction grating marks, thereby measuring positions of the diffraction grating marks.

Examples of the alignment mechanism of the LIA type are disclosed in publications of Japanese Laid-open Patent Applications No. 63-283129 and No. 2-227602. In these alignment mechanisms, the wafer mark and reticle mark are formed in the form of two-dimensional diffraction grating marks arranged in two arrangement directions different from each other or in the form of two mutually different columns of one-dimensional diffraction grating marks arranged in one arrangement direction. Irradiation directions of the two coherent light beams to such diffraction grating marks are set within a plane including the arrangement direction of the linear patterns composing the diffraction grating marks and the normal direction to the surface where the diffraction grating marks are formed and along two directions intersecting in axis symmetry with respect to the normal direction to the mark-formed surface.

SUMMARY OF THE INVENTION

Generally, the projection optical system has a difference in aberration characteristics between in a direction included in the meridional plane (hereinafter referred to generally as "meridional (m) direction") and in a direction included in the sagittal plane (hereinafter referred to generally as "sagittal (s) direction"). Because of this difference, when a position of wafer mark is detected through the projection optical system based on the TTR method, image-forming states of light irradiated to the wafer mark are different between in the m direction and in the s direction. Thus, detection accuracies of positional deviation amount are different between in two arrangement directions of diffraction gratings constituting each of the wafer marks, inclined at mutually different angles with respect to a straight line passing the center of each of the wafer marks covered by the both edge parts of the exposure area on the wafer and the optical axis of projection optical system located on the wafer, that is, between in two scanning directions in which one-dimensional interference fringes corresponding to diffracted light from a measured object run.

Particularly, for the alignment mechanism of the LIA method, it is necessary to accurately set at a predetermined value a ratio between a pitch of the diffraction gratings forming a wafer mark and a pitch of interference fringes made upon irradiation of two light beams thereto. However, the ratio of these two pitches changes from the proper value, depending upon the two mutually different scanning directions to the wafer mark because of the aberration characteristics of projection optical system different between in the m direction and in the s direction. Thus, there are cases that detection errors in positional deviation amount occur based on inconsistencies etc. of the photosensitive agent deposited on the wafer.

The detection accuracies of positional deviation amount could be made coincident in the two directions by differentiating image magnifications of alignment optical systems from each other in correspondence to the two mutually different scanning directions to the wafer mark. In this case, the alignment optical systems would have problems of complex structure and an increase in size.

Further, the two mutually different measuring directions of wafer mark are determined without consideration on aberration characteristics of projection optical system not only in the projection exposure apparatus of the scanning exposure method but also in the projection exposure apparatus of the one-shot exposure method. Therefore, there is a possibility of different detection accuracies of positional deviation amount depending upon the scanning directions of wafer mark.

Therefore, the present invention has been accomplished taking the above-described problems into account, and a first object of the invention is to provide a projection exposure apparatus of the one-shot exposure method provided with an alignment mechanism for performing two-dimensional positioning between the reticle and the wafer with high accuracy by reducing influence due to the aberration characteristics of projection optical system, that is, by making even the detection accuracies of positional deviation amount in a plurality of mutually different scanning directions to the wafer mark.

A second object of the present invention is to provide a projection exposure apparatus of the scanning exposure method provided with an alignment mechanism for performing high-accuracy two-dimensional positioning between the reticle and the wafer on occasion with passage of time in the moving direction upon exposure by making even the detection accuracies of positional deviation amount in a plurality of mutually different scanning directions to the wafer mark.

A first projection exposure apparatus according to the present invention, for achieving the first object as described above, comprises (a) an illumination optical system for irradiating exposure light of a predetermined wavelength to a photomask pattern formed on a reticle, (b) a projection optical system for projecting the exposure light having passed through the whole of the photomask pattern at a predetermined magnification to a photosensitive film formed on a surface of a wafer, (c) a reticle stage for holding the reticle and moving a surface of the reticle within a first reference plane substantially perpendicular to an optical axis of the projection optical system, (d) a wafer stage for holding the wafer and moving the surface of the wafer within a second reference plane substantially perpendicular to the optical axis of the projection optical system and different from the first reference plane, (e) a driving mechanism comprising reticle driving means for driving the reticle stage and wafer driving means for driving the wafer stage, (f) an alignment mechanism for measuring an amount of relative positional deviation between the reticle and the wafer, and (g) a controlling mechanism comprising reticle controlling means for controlling the reticle driving means, wafer controlling means for controlling the wafer driving means, and servo controlling means for controlling at least one of the reticle controlling means and the wafer controlling means, based on the amount of relative positional deviation between the reticle and the wafer, measured by the alignment mechanism.

Here, the alignment mechanism comprises (f-1) a first light-sending system for sending a first light beam and a second light beam different from the first light beam through the projection optical system to the wafer, (f-2) a second light-sending system for sending a third light beam different from the first and second light beams, and a fourth light beam different from the first to third light beams to the reticle, (f-3) a first scanning system for scanning the first light beam along a first scanning straight line included in the surface of the wafer, scanning the second light beam along a second scanning straight line included in the surface of the wafer and being different from the first scanning straight line, and setting the first and second scanning straight lines in axis symmetry with respect to a reference straight line passing an intersecting point between the first and second scanning straight lines and an intersecting point between the surface of the wafer and the optical axis of the projection optical system, (f-4) a second scanning system for scanning the third light beam along a third scanning straight line included in the surface of the reticle, and scanning the fourth light beam along a fourth scanning straight line included in the surface of the reticle and being different from the third scanning straight line, (f-5) a first light-receiving system for detecting reflected light of the first light beam, emergent from the surface of the wafer, and detecting reflected light of the third light beam, emergent from the surface of the reticle, and (f-6) a second light-receiving system for detecting reflected light of the second light beam, emergent from the surface of the wafer, and detecting reflected light of the fourth light beam, emergent from the surface of the reticle.

Further, a second projection exposure apparatus according to the present invention, for achieving the second object as described above, comprises (a) an illumination optical system for irradiating exposure light of a predetermined wavelength to a photomask pattern formed on a reticle, (b) a projection optical system for projecting the exposure light having passed through a part of the photomask pattern at a predetermined magnification to a photosensitive film formed on a surface of a wafer, (c) a reticle stage for holding the reticle and moving a surface of the reticle within a first reference plane substantially perpendicular to an optical axis of the projection optical system, (d) a wafer stage for holding the wafer and moving the surface of the wafer within a second reference plane substantially perpendicular to the optical axis of the projection optical system and different from the first reference plane, (e) a driving mechanism comprising reticle driving means for driving the reticle stage, and wafer driving means for driving the wafer stage, (f) an alignment mechanism for measuring an amount of relative positional deviation between the wafer and the reticle, and (g) a controlling mechanism comprising reticle controlling means for controlling the reticle driving means, thereby moving the surface of the reticle along a moving direction included in the first reference plane, wafer controlling means for controlling the wafer driving means, thereby moving the surface of the wafer along a conjugate moving direction conjugate with the moving direction through the projection optical system and included in the second reference plane, and servo controlling means for controlling at least one of the reticle controlling means and wafer controlling means, based on the amount of relative positional deviation between the reticle and the wafer, measured by the alignment mechanism.

Here, the alignment mechanism comprises (f-1) a first light-sending system for sending a first light beam and a second light beam different from the first light beam through the projection optical system to the wafer, (f-2) a second light-sending system for sending a third light beam different from the first and second light beams, and a fourth light beam different from the first to third light beams to the reticle, (f-3) a first scanning system for scanning the first light beam along a first scanning straight line included in the surface of the wafer, scanning the second light beam along a second scanning straight line included in the surface of the wafer and being different from the first scanning straight line, and setting the first and second scanning straight lines in axis symmetry with respect to a reference straight line passing an intersecting point between the first and second scanning straight lines and an intersecting point between the surface of the wafer and the optical axis of the projection optical system, (f-4) a second scanning system for scanning the third light beam along a third scanning straight line included in the surface of the reticle and scanning the fourth light beam along a fourth scanning straight line included in the surface of the reticle and being different from the third scanning straight line, (f-5) a first light-receiving system for detecting reflected light of the first light beam, emergent from the surface of the wafer and detecting reflected light of the third light beam, emergent from the surface of the reticle, and (f-6) a second light-receiving system for detecting reflected light of the second light beam, emergent from the surface of the wafer and detecting reflected light of the fourth light beam, emergent from the surface of the reticle.

In the first and second projection exposure apparatus as so arranged according to the present invention, the first scanning system in the alignment mechanism first sets the first and second scanning straight lines in axis symmetry with respect to the reference straight line passing the intersecting point between the first and second scanning straight lines included in the surface of the wafer and being different from each other and the intersecting point between the surface of the wafer and the optical axis of the projection optical system, and thereafter scans the first and second light beams along the first and second scanning straight lines, respectively. Here, because the reference straight line passes the intersecting point between the first and second scanning straight lines included in the surface of the wafer and being different from each other and the intersecting point between the surface of the wafer and the optical axis of the projection optical system, it is coincident to the meridional direction or the sagittal direction of the projection optical system.

Since the first and second scanning straight lines are set in axis symmetry with respect to the reference straight line, they are thus inclined at same angles relative to the meridional direction and sagittal direction of the projection optical system. Therefore, the first and second light beams are subjected to influence due to aberration characteristics in the meridional direction of projection optical system and influence due to aberration characteristics in the sagittal direction of projection optical system, which are canceling each other. Accordingly, the alignment mechanism can perform high-accuracy positioning between the reticle and the wafer because it measures amounts of relative positional deviation between the reticle and the wafer along the first and second scanning straight lines with same detection accuracy.

In the first and second projection exposure apparatus according to the present invention, it is preferred that the first scanning system set loci of the first and second light beams on the pupil plane of projection optical system in axis symmetry with respect to an auxiliary reference straight line being parallel to the reference straight line and passing an intersecting point between the pupil plane of projection optical system and the optical axis of projection optical system and that the first scanning system deviate an intersecting point between the loci of the first and second light beams along the auxiliary reference straight line with respect to the intersecting point between the surface of wafer and the optical axis of projection optical system. In this case, an incident direction of the first light beam to the first scanning straight line is inclined in a direction perpendicular to the first scanning straight line, and an incident direction of the second light beam to the second scanning straight line is inclined in a direction perpendicular to the second scanning straight line.

This makes the reflected light of the first and second light beams emergent in axis symmetry with respect to the normal line to the surface of wafer, so that loci of the reflected light of the first and second light beams on the pupil plane of projection optical system are located in parallel to the loci of the first and second light beams thereon and in axis symmetry therewith with respect to the auxiliary reference straight line. Since the first and second light beams and the reflected light thereof are thus spatially separated from each other in the pupil space of projection optical system, the first and second light beams are free of influence due to the reflected light, and the reflected light of the first and second light beams is free of influence due to mutual interference. Accordingly, the alignment mechanism performs the positioning between the reticle and the wafer with much higher accuracy because it precisely measures an amount of relative positional deviation between the reticle and the wafer.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 18 is a perspective view to show optical paths of alignment light in the projection optical system where telecentricity breaking is not effected on the alignment mechanism in the projection exposure apparatus of FIG. 14;

FIG. 19 is a perspective view to show optical paths of alignment light in the projection optical system where conventional telecentricity breaking is effected on the alignment mechanism in the projection exposure apparatus of FIG. 14;

DESCRIPTION OF THE PREFERRED EMBODIMENTS

Figure 1:
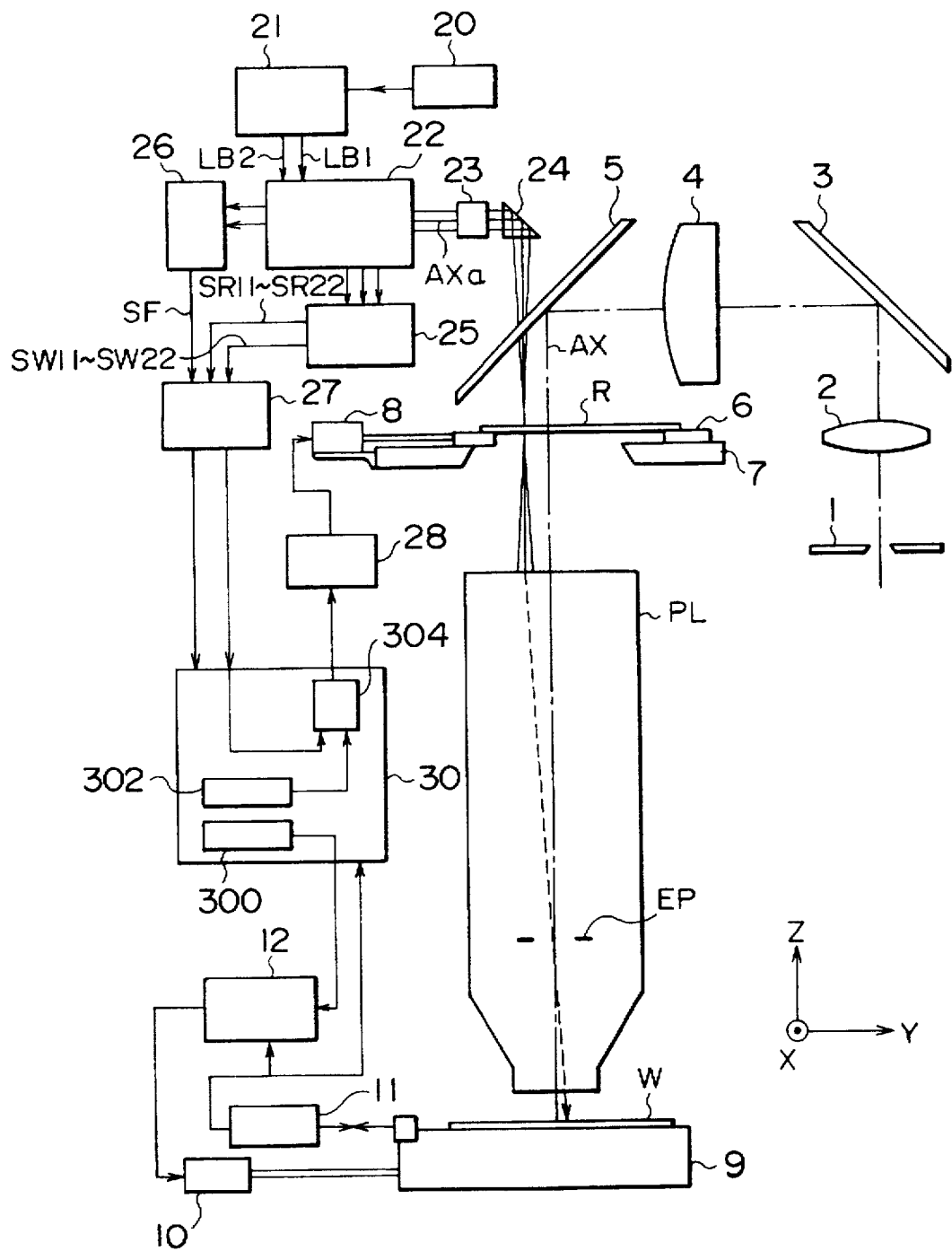
FIG. 1 is a side view to show the structure in the YZ plane, of the projection exposure apparatus as a first embodiment according to the present invention.

The constitution and operation of the embodiments of the projection exposure apparatus according to the present invention will be described with reference to FIG. 1 to FIG. 29. In the description of the drawings, the same elements will be denoted by the same reference numerals and redundant description will be omitted. It is also noted that dimensional ratios in the drawings do not always coincide with those in the description.

In the following embodiments, the present invention is applied to the projection exposure apparatus for, based on the one-shot exposure method or scanning exposure method, projecting an image of a photomask pattern formed on a reticle at a predetermined magnification (including demagnifying ratios and a ratio of 1:1), thereby effecting exposure of the image of the photomask pattern on a wafer coated with a photosensitive agent. Here, it should be noted that these embodiments do disclose the details of the alignment mechanism for performing two-dimensional positioning between the reticle and the wafer, but do not fully disclose the projection optical system or the stage mechanism.

Incidentally, "telecentricity breaking" means to break the telecentricity of light beam on purpose in the projection optical system generally used in a state of bitelecentricity.

First Embodiment

The present embodiment is an example in which the present invention is applied to the projection exposure apparatus of the scanning exposure method, specifically the step-and-scan method. Namely, the present embodiment is a projection exposure apparatus of the mask aligner type provided with an alignment mechanism of the TTR method and the LIA (double beam interference) type.

Figure 2:
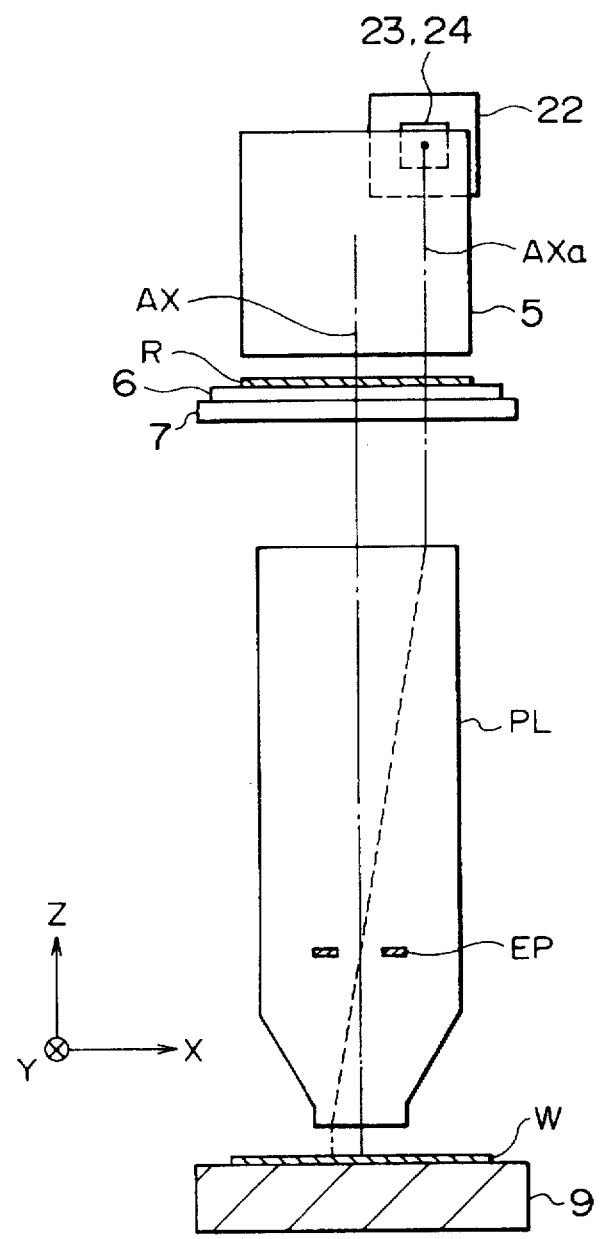
FIG. 2 is a side view to show the partial structure in the XZ plane, of the projection exposure apparatus of FIG. 1.

As shown in FIG. 1 and FIG. 2, the coordinate axes set for the projection exposure apparatus are defined in such a manner that the Z axis is parallel to the optical axis of the projection optical system PL, the Y axis is parallel to moving directions of reticle R and wafer W, and the X axis is parallel to the direction perpendicular to the Z axis and Y axis. In an illumination optical system included in the projection exposure apparatus, illumination light (exposure light) emitted from a light source for exposure (not shown) is guided through a fly's eye lens (not shown) etc. so as to have a uniform illuminance distribution and to illuminate a reticle blind 1 as an illumination field stop. The reticle blind 1 is provided with a slit aperture for illuminating an area on the reticle R in a slit pattern. The longitudinal direction of the slit aperture is arranged as parallel to the X axis perpendicular to the scanning directions of reticle R and wafer W.

The illumination light having passed the slit aperture in the reticle blind 1 then travels via a lens system 2, a mirror 3, a condenser lens 4 and a dichroic mirror (or beam splitter) 5 to reach the reticle R. The reticle blind 1 is located as conjugate with a pattern surface of reticle R (i.e., the back face of reticle R opposed to the projection optical system PL) with respect to a combinational system of the lens system 2 and condenser lens 4. By this arrangement, a slit illumination area is formed as an Image of the illumination light having passed the slit aperture on the pattern surface of reticle R. The optical axis AX of the projection optical system PL and the illumination optical system (lens system 2, condenser lens 4, etc.) is located at the center of the slit illumination area.

The reticle R is sucked and held on a reticle stage 6 arranged as movable in a large amount in a predetermined XY plane (first reference plane). Namely, the reticle stage 6 is set on a column 7 and is moved at a constant speed V along the Y-axis direction by a drive motor (reticle driving means) 8. Also, the reticle stage 6 is arranged to finely move in the X-axis direction and in a rotational direction (θ direction) around each coordinate axis by well-known reticle driving means (not shown), for alignment of reticle R.

Figure 3:
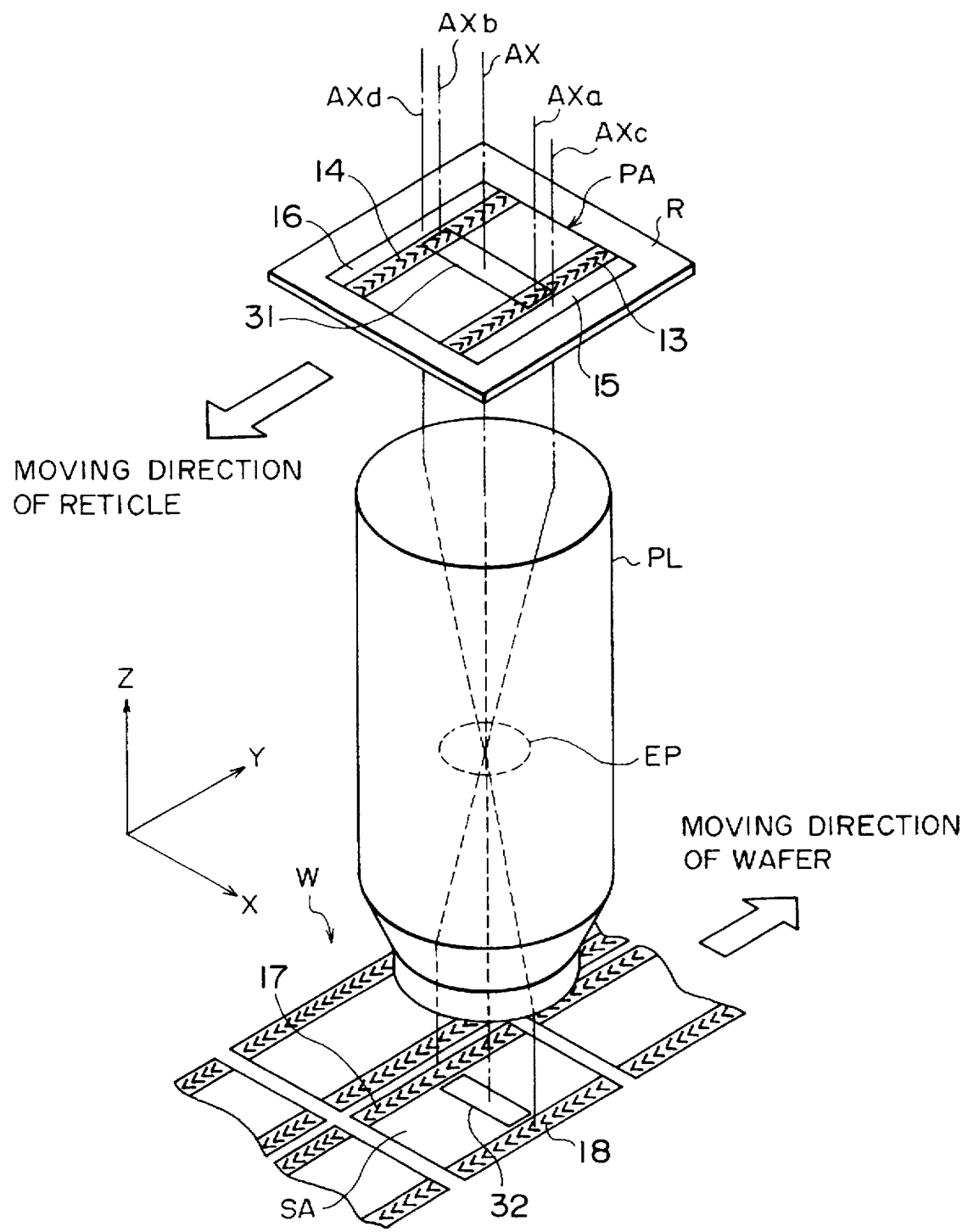
FIG. 3 is a perspective view to show a schematic state of scanning exposure by the projection exposure apparatus of FIG. 1.

As shown in FIG. 3, an image of a photomask pattern formed on the reticle R and located in the slit illumination area 31 is projected to be focused in a slit exposure area 32 of each shot area on the wafer W through the projection optical system PL. An example of the projection optical system PL is a projection lens which is of a 5:1 reduction full-field type composed only of refractive elements (refractive lenses) and which is telecentric both on the reticle R side and the wafer W side. In synchronization with a process for moving the reticle R in the −Y direction (or in the +Y direction) relative to the illumination area 31, the wafer W is moved relative to the exposure area 32 in the +Y direction (or in the −Y direction), whereby sequential exposure of the photomask pattern of reticle R is effected in the shot area SA of wafer W.

As shown in FIG. 1 and FIG. 2, the wafer W is mounted on a wafer stage 9 arranged to move in a large amount in a predetermined XY plane (second reference plane). The wafer stage 9 is moved at a constant speed βv along the Y-axis direction by a drive motor (wafer driving means) 10, where β is a projection magnification of projection optical system. A laser interferometer 11 measures on occasion a change of a coordinate position of the wafer stage 9. The laser interferometer 11 also measures moving speeds of the wafer stage 9 in the X-axis direction and in the Y-axis direction, and supplies the thus measured coordinates and moving speeds to a drive controlling unit 12. The drive controlling unit (wafer controlling means) 12 controls the drive motor 10 in an optimum drive sequence, based on the position information and speed information output from the laser interferometer 11. The present embodiment is so arranged that scanning exposure is made based on movement of the wafer stage 9 along the Y-axis direction and that stepping is made based on movement thereof in the X-axis direction, but the moving directions for scanning exposure and stepping may be interchanged with each other.

Another laser interferometer (not shown) also measures a coordinate position, a rotational (yawing) error, etc. of the reticle stage 6. This laser interferometer also measures moving speeds of the reticle stage 6 in the X-axis direction and in the Y-axis direction, and supplies the thus measured coordinates and moving speeds to a drive controlling unit 28. The drive controlling unit (reticle controlling means) 28 controls the drive motor 8 in an optimum drive sequence, based on the position information and speed information output from the laser interferometer (not shown).

As shown in FIG. 3, the reticle R and wafer W are moved in mutually opposite directions along the Y-axis direction, and diffraction grating marks (reticle marks) 13, 14 having two types of mutually different pitches are formed as aligned along the Y-axis direction in two columns of mark forming regions located in peripheral portions around the pattern area PA on the reticle R and extending in the Y-axis direction. Slit windows 15, 16 are formed with optical transparency outside the diffraction grating marks 13, 14, respectively. The diffraction grating marks 13, 14 are arranged apart from each other in the X-axis direction on either side of the pattern area PA, but they are made coincident in a positional relation (phase) between the diffraction grating patterns extending along the Y-axis direction.

On the other hand, diffraction grating marks 17, 18 corresponding to the diffraction grating marks 13, 14 are formed as aligned along the Y-axis direction in two columns of mark forming regions extending in the Y-axis direction and positioned in respective peripheral portions around each of a plurality of shot areas SA on the wafer W. Namely, the diffraction grating mark 17 is formed, similarly as an image of the diffraction grating mark 13 is, in a street line area as being one mark forming area and conjugate with the window 15 of reticle R through the projection optical system PL. The diffraction grating mark 18 is formed, similarly as an image of the diffraction grating mark 14 is, in a street line area as being the other mark forming area and conjugate with the window 16 of reticle R through the projection optical system PL.

In this case, two-dimensional positions of the diffraction grating marks 13, 14 on the reticle R are detected by alignment optical systems having respective optical axes AXa, AXb, and two-dimensional positions of the diffraction grating marks 17, 18 on the wafer W are detected by alignment optical systems having respective optical axes AXc, AXd. Then these alignment optical systems detect an amount of relative two-dimensional positional deviation between the diffraction grating marks 13, 17 and an amount of relative two-dimensional positional deviation between the diffraction grating marks 14, 18 on occasion with passage of time during scanning exposure. Thus, the projection optical apparatus finely adjusts at least one of the positions of the reticle R and wafer W, thereby returning the amounts of relative positional deviation measured by the alignment optical systems to a predetermined value. These four optical axes AXa to AXd intersect with the optical axis AX of projection optical system PL at the center of the pupil plane EP of projection optical system PL (a Fourier transform plane for reticle R in the projection optical system PL).

As shown in FIG. 1 and FIG. 2, a coherent and linearly polarized laser beam emitted from a laser light source 20 such as Ne-Ne, He-Cd, or Ar ion laser, is incident into a double-beam-forming frequency shifter 21, and thereby is split into two laser beams LB1, LB2 having a frequency difference $\Delta f$ therebetween. This frequency difference $\Delta f$ has an upper limit determined by frequency response of a photoelectric detector for receiving interference light emergent from the alignment mark. For example, if the photoelectric detector is a semiconductor sensor such as a photodiode, the frequency difference $\Delta f$ should be preferably not more than 100 kHz in practical applications, for example about 50 kHz. If a photomultiplier tube (photomultiplier) is used as the photoelectric detector, the frequency difference $\Delta f$ can be set at a relatively high frequency.

Figure 4:
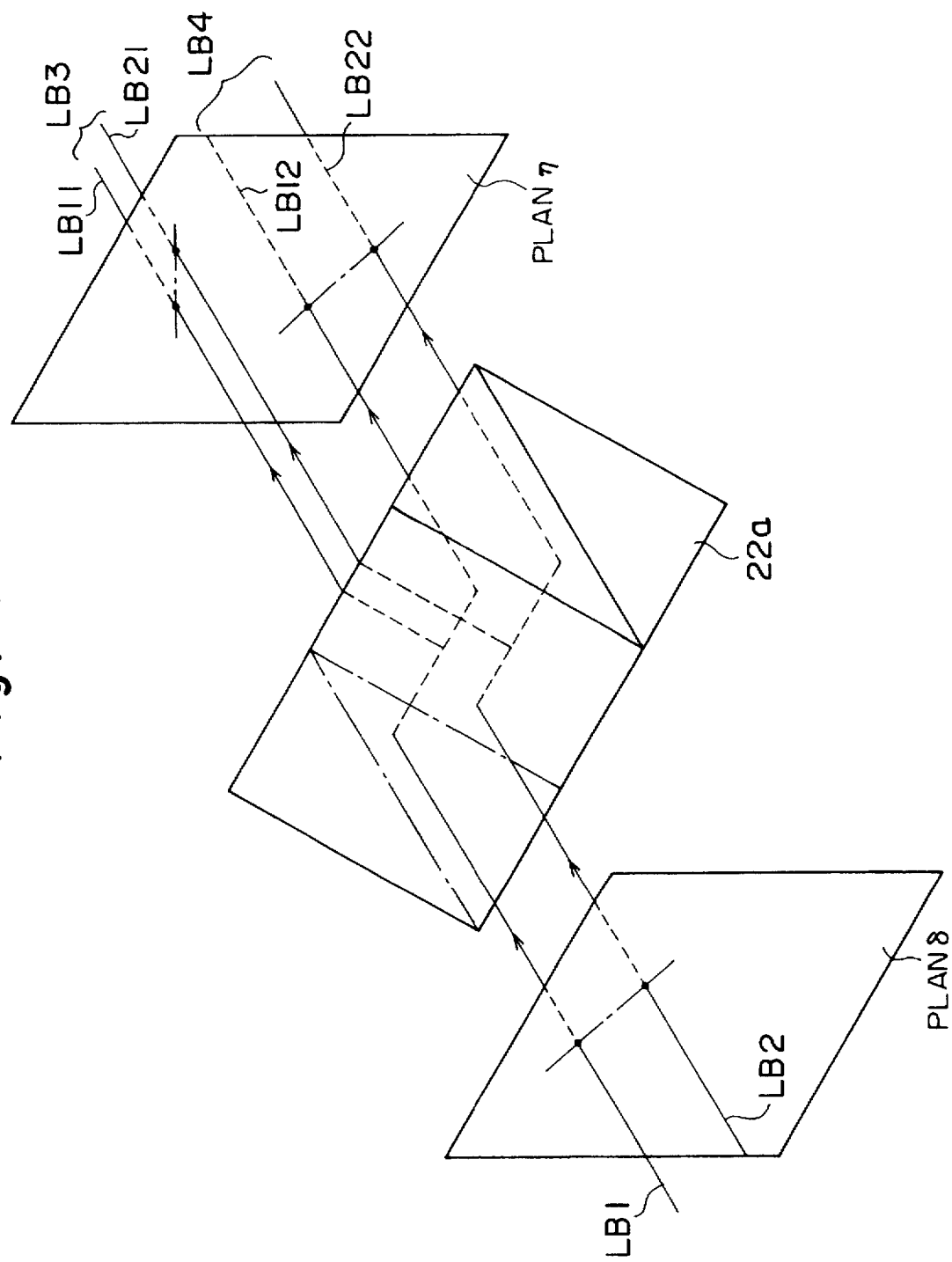
FIG. 4 is a perspective view to show the partial structure of a transmission-reception separating optical system included in the projection exposure apparatus of FIG. 1.

The two laser beams LB1, LB2 emergent from the double-beam-forming frequency shifter 21 are guided into a transmission-reception separating optical system 22 to be distributed to four alignment optical systems. Here, as shown in FIG. 4, the transmission-reception separating optical system 22 is constructed to include a prism 22a of a rhombic cylinder. This prism 22a is disposed in optical paths of the two laser beams LB1, LB2 to split the laser beam LB1 into two laser beams LB11, LB12 and to split the laser beam LB2 into two laser beams LB21, LB22. Thus, a laser beam pair LB3 irradiated to the alignment mark on the wafer W along one scanning straight line and a laser beam pair LB4 irradiated to the alignment mark on the reticle R along the other scanning straight line are supplied to each alignment optical system. The laser beam pair LB3 is composed of the two laser beams LB11, LB21, and the laser beam pair LB4 is composed of the two laser beams LB12, LB22.

It is necessary herein that on a plane $\eta$ perpendicular to the four laser beams LB11 to LB22 emergent from the prism 22a, a distribution of intersecting points of the two laser beams LB11, LB21 therewith and a distribution of intersecting points of the two laser beams LB12, LB22 be made correspondent along the two scanning straight lines different from each other for the alignment marks on the reticle R or wafer W. For that purpose, a distribution of intersecting points of the two laser beams LB1, LB2 needs to be adjusted on a plane $\delta$ perpendicular to the two laser beams LB1, LB2 incident into the prism 22a.

Here, an objective lens 23 and a mirror for vertical illumination 24 are illustrated as those included in one of the four alignment optical systems. Namely, the optical axis of the objective lens 23 is nearly coincident with the optical axis AXc among the optical axes AXa to AXd of the four alignment optical systems. The two laser beam pairs LB3, LB4 supplied to the alignment optical system as shown enter the objective lens 23 so as to be eccentric in symmetry with respect to the optical axis AXc of the objective 23, whereby they are reflected by the vertical illumination mirror 24 to pass through the dichroic mirror 5 and thereafter cross each other in the form of mutually parallel beams at a focal point of the objective 23 located in the window 15 on the pattern surface of reticle R. The two laser beams LB3, LB4 passing the window 15 are incident so as to cross at a predetermined cross angle on the diffraction grating mark 17 on the wafer W through the projection optical system PL.

The projection optical system PL is corrected for various aberrations for the exposure light while there is a possibility that axial chromatic aberration still remains for the two laser beam pairs LB3, LB4. Thus, when such axial chromatic aberration remains, an optical path controlling member for deflecting the optical paths of laser beam pairs LB3, LB4 to correct for axial chromatic aberration is provided at intersecting points between the pupil plane EP of projection optical system PL and the optical paths of laser beam pairs LB3, LB4. Such an optical path controlling member is preferably constructed for example of a phase type diffraction grating or a prism, etc. By this, the laser beam pairs LB3, LB4 each accurately cross on the diffraction grating mark 17 on the wafer W through the projection optical system PL.

Figure 7:
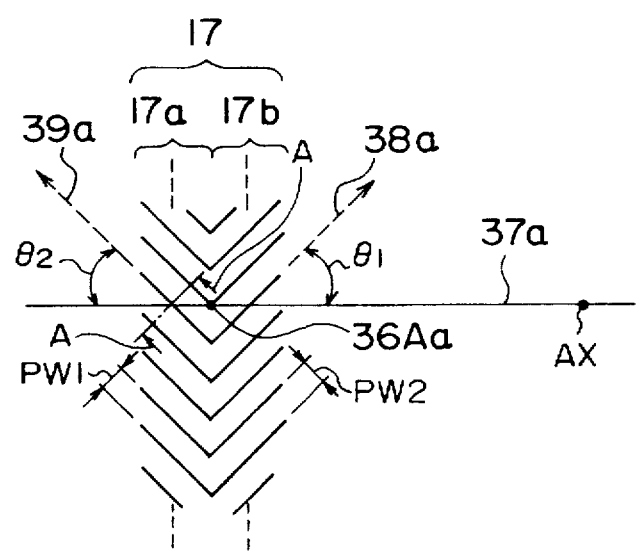
FIG. 7 is a plan view to show the partial structure in the XY plane, of one wafer mark of FIG. 6.
Figure 8:
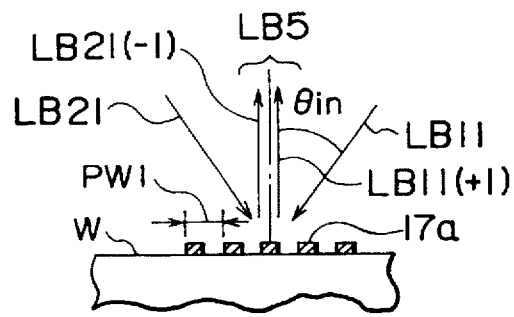
FIG. 8 is a cross section to show the partial structure of wafer along the A—A line in FIG. 7.

As shown in FIG. 7, the diffraction grating mark 17 has scan directions 38a and 39a perpendicular to each other. Namely, a diffraction grating 17a is formed at pitch PW1 along the scan direction 38a, and a diffraction grating 17b at pitch PW2 (=PW1) along the scan direction 39a. The diffraction gratings 17a, 17b each are formed as aligned along the moving direction (the Y-axis direction). As shown in FIG. 8, the two laser beams LB11, LB21 forming the laser beam pair LB3 symmetrically cross each other at respective incident angles $\theta_{in}$ along the scan direction 38a of the diffraction grating 17a. Also, the two laser beams LB12, LB22 constituting the laser beam pair LB4 symmetrically cross each other at respective incident angles $\theta_{in}$ along the scan direction 39a of the diffraction grating 17b.

Figure 9:
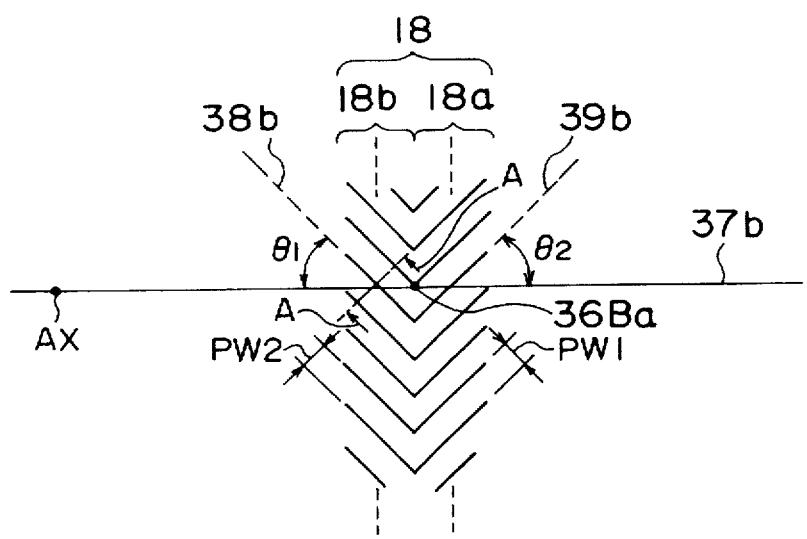
FIG. 9 is a plan view to show the partial structure in the XY plane, of the other wafer mark of FIG. 6.

As shown in FIG. 9, the diffraction grating mark 18 has scan directions 38b, 39b perpendicular to each other.

Figure 10:
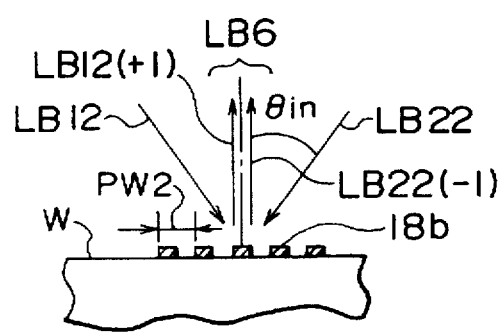
FIG. 10 is a cross section to show the partial structure of wafer along the A—A line in FIG. 9.

Namely, a diffraction grating 18a is formed at pitch PW1 along the scan direction 38b, and a diffraction grating 18b at pitch PW2 along the scan direction 39b. The diffraction gratings 18a, 18b each are formed as aligned along the moving direction. As shown in FIG. 10, the two laser beams LB12, LB22 constituting the laser beam pair LB4 symmetrically cross each other at respective incident angles $\theta_{in}$ along the scan direction 39b of the diffraction grating 18b. Also, the two laser beams LB11, LB21 constituting the laser beam pair LB3 symmetrically cross each other at respective incident angles $\theta_{in}$ along the scan direction 38b of the diffraction grating 18a.

The crossing of the laser beam pair LB3 produces one-dimensional interference fringes along the scan direction 38a on the diffraction grating 17a. Since the two laser beams (sent beams) LB11, LB21 has the frequency difference $\Delta f$ therebetween, the interference fringes flow in the scan direction (pitch direction) 38a take a speed proportional to $\Delta f$. Here, the incident directions of the two laser beams LB11, LB21 are determined so as to make the scan direction of diffraction grating 17a coincident with the running direction of the interference fringes. A cross angle $2\theta_{in}$ between the two laser beams LB11, LB21 is determined so as to satisfy a predetermined relation between the pitch PW1 of the diffraction grating 17a and the pitch Pc of the interference fringes (for example, PW1=n·Pc, using integers n not less than 1). By this, for example, + first order diffracted light LB11 (+1) of the laser beam LB1 and —first order diffracted light LB21 (−1) of the laser beam LB21 are emergent in parallel to the normal line to the wafer W from the diffraction grating 17a. Similarly, + first order diffracted light LB12 (+1) of the laser beam LB 12 and—first order diffracted light LB22 (−1) of the laser beam LB22 are emergent in parallel to the normal line to the wafer W from the diffraction grating 17b.

The + first order diffracted light LB11 (+1) and − first order diffracted light LB21 (−1) are coupled with each other to form beat interference light LB5 having a beat frequency coincident with the frequency difference $\Delta f$. Also, the + first order diffracted light LB12 (+1) and− first order diffracted light LB22 (−1) are coupled with each other to form beat interference light LB6 having a beat frequency coincident with the frequency difference $\Delta f$. Here, if the scan direction of diffraction grating 17a becomes discordant with the running direction of the interference fringes, the phase of the beat interference light LB5 will change. If the scan direction of diffraction grating 17b becomes discordant with the running direction of the interference fringes, the phase of the beat interference light LB6 will change. Detecting the phase changes of photoelectrically converted signals of these two beat interference light beams LB5, LB6, positions can be detected in the scan direction 38 of the diffraction grating 17a and in the scan direction 39 of the diffraction grating 17b.

As shown in FIG. 1, the two beat interference beams LB5, LB6 are guided via the projection optical system PL, the window 16 of reticle R, the dichroic mirror 5, the vertical illumination mirror 24; the objective lens 23, and the transmittance-reception separating optical system 22 to a photoelectric detecting unit 25. The photoelectric detecting unit 25 photoelectrically converts the beat interference beams LB5, LB6 to output sinusoidal wafer detection signals SW11, SW12, respectively.

The two laser beam pairs LB3, LB4, which are supplied from the transmission-reception separating optical system 22 to another alignment optical system and which are incident into the objective 23 as eccentric in symmetry with respect to the optical axis AXd of the objective 23, are incident at a predetermined cross angle upon the diffraction grating mark 18 of wafer W through the projection optical system PL. By this, the photoelectric detecting unit 25 photoelectrically converts the two beat interference light beams LB5, LB6 emergent from the diffraction grating mark 18, thereby outputting sinusoidal wafer detection signals SW21, SW22.

Also, the two laser beam pairs LB3, LB4, which are supplied from the transmission-reception separating optical system 22 to another alignment optical system and which are incident into the objective 23 as eccentric in symmetry with respect to the optical axis AXa of the objective 23, are incident at a predetermined cross angle upon the diffraction grating mark 13 adjacent to the window 15 of reticle R conjugate with the diffraction grating mark 17 of wafer W through the projection optical system PL. By this, the photoelectric detecting unit 25 photoelectrically converts the two beat interference light beams LB5, LB6 emergent from the diffraction grating mark 13, thereby outputting sinusoidal reticle detection signals SR11, SR21.

Further, the two laser beam pairs LB3, LB4, which are supplied from the transmission-reception separating optical system 22 to the other alignment optical system and which are incident into the objective 23 as eccentric in symmetry with respect to the optical axis AXb of the objective 23, are incident at a predetermined cross angle on the diffraction grating mark 14 adjacent to the window 16 of reticle R conjugate with the diffraction grating mark 18 of wafer W through the projection optical system PL. By this, the photoelectric detecting unit 25 photoelectrically converts the two beat interference light beams LB5, LB6 emergent from the diffraction grating mark 13, thereby outputting sinusoidal reticle detection signals SR12, SR22.

These four types of wafer detection signals SW11 to SW22 and four types of reticle detection signals SR11 to SR22 are input as beat ac signals having a same frequency into a phase difference measuring unit 27. The phase difference measuring unit 27 detects a phase difference $\Delta\Phi 11$ between the wafer detection signal SW11 and the reticle detection signal SR11, thereby calculating an amount of relative positional deviation between the wafer W and the reticle R, specifically between a position of wafer W along the scan direction 38a of diffraction grating mark 17 and a position of reticle R along the scan direction of diffraction grating mark 13 conjugate with the scan direction 38a through the projection optical system PL. The phase difference measuring unit 27 detects a phase difference $\Delta\Phi 21$ between the wafer detection signal SW21 and the reticle detection signal SR21, thereby calculating an amount of relative positional deviation between the wafer W and the reticle R, specifically between a position of wafer W along the scan direction 39a of diffraction grating mark 17 and a position of reticle R along the scan direction of diffraction grating mark 13 conjugate with the scan direction 39a through the projection optical system PL.

Further, the phase difference measuring unit 27 detects a phase difference $\Delta\Phi 12$ between the wafer detection signal SW12 and the reticle detection signal SR12, thereby calculating an amount of relative positional deviation between the wafer W and the reticle R, specifically between a position of wafer W along the scan direction 38b of diffraction grating mark 18 and a position of reticle R along the scan direction of diffraction grating mark 14 conjugate with the scan direction 38b through the projection optical system PL. The phase difference measuring unit 27 detects a phase differ- ence $\Delta\Phi 22$ between the wafer detection signal SW22 and the reticle detection signal SR22, thereby calculating an amount of relative positional deviation between the wafer W and the reticle R, specifically between a position of wafer W along the scan direction 39b of diffraction grating mark 18 and a position of reticle R along the scan direction of diffraction grating mark 14 conjugate with the scan direction 39b through the projection optical system PL.

The thus calculated amounts of relative positional deviation between the wafer W and the reticle R are supplied to a main control unit 30. This main control unit 30 is constructed to include a servo controlling means, and successively outputs correction values to either one of drive controlling units 9, 28, thereby setting the amounts of relative positional deviation between the wafer W and the reticle R to a predetermined value. The phase difference measuring unit 27 can detect phase differences normally in the range of −180° to +180°. The upper limit and lower limit of the phase differences correspond to (½) PW1 and (¼) PW1, respectively.

Here, the projection exposure apparatus of the present embodiment performs scan exposure while moving both the reticle R and wafer W at high speed. In this arrangement, when the diffraction grating marks formed on the reticle R or wafer W continuously move at a speed v [mm/s] in the pitch direction relative to a cross area of two laser beams having the frequency difference Δf [kHz], the beat interference light emergent from the diffraction grating marks is subjected to the Doppler effect, and the frequency of the wafer detection signals or reticle detection signals obtained by photoelectric conversion of the beat interference light is greatly changed from Δf. Such a frequency fs [kHz] of wafer detection signals or reticle detection signals is expressed by Formula (1) where the pitch along the scan direction of diffraction grating marks formed on the reticle R or wafer W is Pg [μm].

$$fs = \Delta f + 2v/Pg \quad (1)$$

Here, an example of the frequency difference Δf between the two laser beams irradiating the diffraction grating marks is set at 50 kHz in the present embodiment. For example, when v=−100 mm/s and Pg=8 μm, fs=25 kHz; when v=+100 mm/s and Pg=8 μm, fs=75 kHz. It is thus necessary to limit the moving speeds of reticle stage 6 and wafer stage 9. For example, if the moving speeds of the two stages are set small, the frequency of wafer detection signals and reticle detection signals becomes a value not to cause a problem in measuring the phase difference. It is also effective to avoid setting the moving directions of reticle R and wafer W to directions to decrease the frequency of wafer detection signals and reticle detection signals. That is, it is effective to limit the moving direction of reticle R only to the +Y axis direction and to limit the moving direction of wafer W only to the −Y axis direction.

For executing alignment for the reticle R and wafer W under motion more easily, the main controlling unit 30 herein is constructed of a controlling part 300 for controlling the speed and position of wafer stage 9 for driving it at a constant speed controlled, a controlling part 302 for controlling the speed and position of the reticle stage 6 for driving it at a constant speed controlled, and a tracking-scan controlling part 304 for servo-controlling at least one of the reticle stage 6 and the wafer stage 9.

For executing normal positioning of the reticle alone, or so-called reticle alignment, and positioning of the wafer alone, or wafer global alignment (or enhanced global alignment (EGA)), the controlling parts 300 and 302 achieve respective functions as usual without a mutual relation with each other. For executing the scan exposure as keeping the tracking-scan controlling part 304 in an off state, the controlling parts 300 and 302 control the relative position between the reticle stage 6 and the wafer stage 9, and the speeds thereof in cooperation with each other. For executing the scan exposure as setting the tracking-scan controlling part 304 in an on state, the controlling part 300 simply controls the wafer stage 9 at a constant speed, whereas the controlling part 302 controls the reticle stage 6 so as to follow the wafer stage 9 at a speed corresponding thereto and servo-controls the drive controlling unit 28, thereby setting amounts of positional deviation successively output from the phase difference measuring unit 27 always to a constant value. Of course, the reticle stage 6 may be controlled by constant speed control and the wafer stage 9 by tracking control.

Namely, the present embodiment employs such a control that either one of the reticle R and wafer W is moved at a constant speed and the other is controlled to follow movement of the selected one, noting that the detecting unit outputs the wafer detection signals and reticle detection signals on occasion with passage of time during scanning exposure, in other words, noting that the detecting unit successively detects changes in relative positional deviation amounts between the reticle R and the wafer W.

The two laser beams LB1, LB2 emergent from the double-beam-forming frequency shifter 21 are also distributed through the transmission-reception separating optical system 22 to a reference detecting system 26. The reference detecting system 26 detects the frequency difference Δf between the two laser beams LB1, LB2, thereby outputting a sinusoidal reference signal SF having a beat frequency coincident with the frequency difference Δf to the phase difference measuring unit 27.

The phase difference measuring unit 27 obtains a deviation of the initial position of reticle R, based on phase differences between the reference signal SF and the reticle detection signals SR11 to SR22, and also obtains a deviation of the initial position of wafer W, based on phase differences between the reference signal SF and the wafer detection signals SW11 to SW22. Further, the phase difference measuring unit 27 is constructed to include a circuit for detecting frequency changes of the reticle detection signals and wafer detection signals, so as to quantify the frequency changes of wafer detection signals or reticle detection signals relative to the reference signal SF, whereby the measuring unit 27 can directly detect a speed change of reticle stage 6 or wafer stage 9.

As shown in FIG. 2, because the alignment optical systems corresponding to the optical axes AXa to AXd detect an amount of two-dimensional positional deviation between the grating mark 13 and the grating mark 17 and an amount of two-dimensional positional deviation between the grating mark 14 and the grating mark 18, the apparatus successively detects during scanning exposure not only an amount of two-dimensional positional deviation between the pattern area PA of reticle R and the shot area SA of wafer W but also an error of relative rotational angle between the pattern area PA and the shot area SA.

A certain permissible amount is also determined for the error of relative rotational angle by the size of pattern area PA or shot area SA, or the value of minimum line width. When the rotational error exceeds the permissible value, the rotational error is fed back to a rotating mechanism for finely rotating the reticle stage 6 to correct the rotational error in real time during scanning exposure. Here, the rotation center of the rotating mechanism is coincident with the center of slit aperture image of the reticle blind 1 projected onto the reticle R, that is, with the center of slit illumination area 31.

Figure 5:
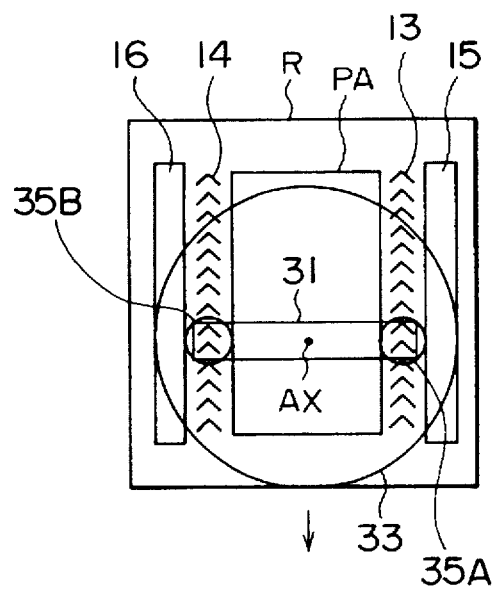
FIG. 5 is a plan view to show an arrangement in the XY plan, of a pattern area and reticle marks of reticle in the projection exposure apparatus of FIG. 1.

As shown in FIG. 5, formed on either side of the pattern area PA of reticle R are the diffraction grating marks 13, 14 consisting of inverse V-shaped patterns aligned along the moving direction (Y direction). Formed outside these diffraction grating marks 13, 14 are the windows 15, 16 for transmitting a laser beam, which are conjugate with the diffraction grating marks 17, 18 of wafer W through the projection optical system PL. In a maximum effective transfer area 33 of reticle R conjugate with a maximum effective exposure field 34 of the projection optical system PL, scan areas 35A, 35B of the alignment mechanism of the LIA type are set in the both ends of the slit illumination area 31. Position detection of the diffraction grating mark 13 is carried out in the scan area 35A, and position detection of the diffraction grating mark 14 in the scan area 35B.

Figure 6:
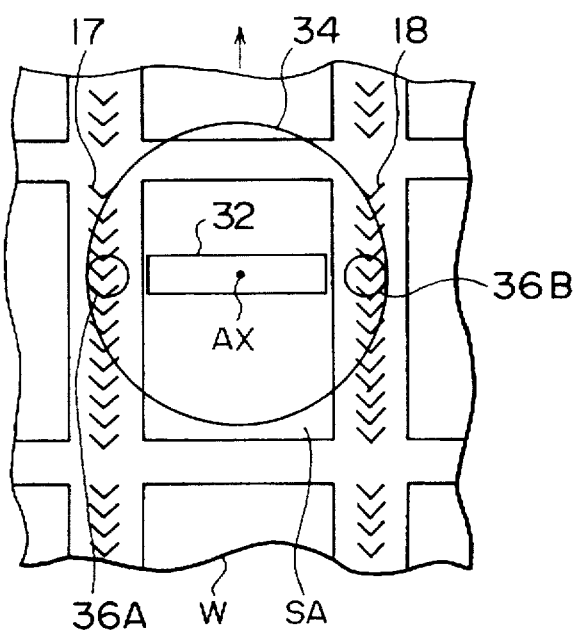
FIG. 6 is a plan view to show an arrangement in the XY plane, of a shot area and wafer marks of wafer in the projection exposure apparatus of FIG. 1.

As shown in FIG. 6, formed on either side of the shot area SA of wafer W are the diffraction grating marks 17, 18 consisting of V-shaped patterns aligned along the moving direction (Y direction). In the maximum effective exposure field 34 of the projection optical system PL, scan areas 36A, 36B of the alignment mechanism of the LIA type are set outside the slit exposure area 32. Position detection of the diffraction grating mark 17 is carried out in the scan area 36A, and position detection of the diffraction grating mark 18 in the scan area 36B.

Figure 11:
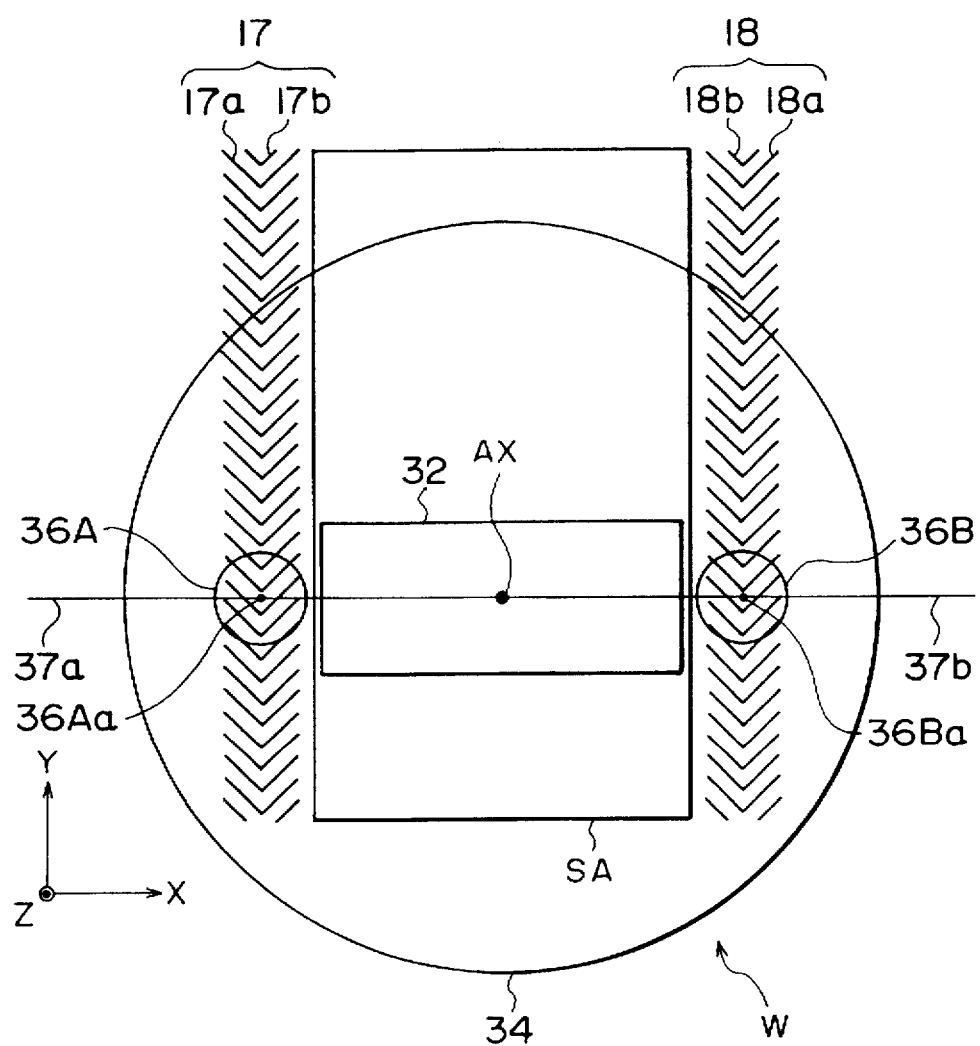
FIG. 11 is a plan view to show the detailed arrangement in the XY plane, of the exposure area to the shot area and the scanning area to the wafer marks in FIG. 6.

As shown in FIG. 11, the diffraction grating mark 17 on the wafer W is composed of a diffraction grating 17a aligned along the scan direction (pitch direction) 38a and a diffraction grating 17b aligned along the scan direction 39a. The center of an illumination area of the two laser beams LB11, LB21 incident on the diffraction grating 17a and the center of an illumination area of the two laser beams LB12, LB22 incident on the diffraction grating 17b are almost coincident with the center 36Aa of the scan area 36A of the alignment optical system. The center 36Aa the scan area 36A is an intersecting point between a first scan straight line parallel to the scan direction 38a in the surface of wafer W and a second scan straight line parallel to the scan direction 39a in the surface of wafer W.

The first and second scan straight lines are set in axis symmetry with respect to a reference straight line 37a passing the intersecting point between the surface of wafer W and the optical axis AX of projection optical system PL, and the center 36Aa of the scan area 36A. Namely, a counterclockwise angle $\theta_1$ between the first scan line and the reference line 37a is coincident with a clockwise angle $\theta_2$ between the second scan line and the reference line 37a. In the diffraction grating mark 17, the pitch PW1 in the scan direction 38a may be set to be different from the pitch PW2 in the scan direction 39a.

On the other hand, the diffraction grating 18 on the wafer W is composed of a diffraction grating 18a aligned along the scan direction 38b, and a diffraction grating 18b aligned along the scan direction 39b. The center of an illumination area of the two laser beams LB11, LB21 incident on the diffraction grating 18a and the center of an illumination area of the two laser beams LB12, LB22 incident on the diffraction grating 18b are approximately coincident with the center 36Ba of the scan area 36B of the alignment optical system. The center 36Ba of the scan area 36B is an intersecting point between a third scan straight line parallel to the scan direction 38b in the surface of wafer W and a fourth scan straight line parallel to the scan direction 39b in the surface of wafer W.

Then the third and fourth scan straight lines are set in axis symmetry with respect to a reference straight line 37b passing the intersecting point between the surface of wafer W and the optical axis AX of projection optical system PL, and the center 36Ba of the scan area 36B. Namely, a clockwise angle $\theta_1$ between the third scan line and the reference line 37b is coincident with a counterclockwise angle $\theta_2$ between the fourth scan line and the reference line 37b. In the diffraction grating mark 18, the pitch PW1 in the scan direction 38b may be set to be different from the pitch PW2 in the scan direction 39b.

As a result, upon detecting a position of the diffraction grating mark 17, 18 through the projection optical system PL, a ratio between the m-directional component and the s-directional component included in the laser beam pair LB3 becomes equal to a ratio between the m-directional component and the s-directional component included in the laser beam pair LB4. This makes coincident with each other the influence on the two laser beam pairs LB3, LB4 based on characteristics of aberrations (image magnification, longitudinal aberrations such as astigmatism, or lateral aberrations such as coma, etc.), which are generally different between in the m direction and in the s direction in the projection optical system PL. Thus, detection accuracy of wafer W in correspondence to the scan directions 38a, 38b of the laser beam pair LB3 becomes equal to detection accuracy of wafer W in correspondence to the scan directions 39a, 39b of the laser beam pair LB4. Since image magnifications of projection optical system PL are the same in the scan directions 38a, 38b, 39a, 39b, the cross angles of the two laser beam pairs LB3, LB4 can be determined with high accuracy, especially in the LIA type, whereby the diffraction grating marks 17, 18 can be accurately position-detected in the scan directions 38a, 38b, 39a, 39b.

If the scan directions 38a, 38b, 39a, 39b were set as to be parallel (in the m direction) and perpendicular (in the s direction) to the reference lines 37a, 37b, a difference particularly between the projection magnifications in the m direction and in the s direction would become maximum because of direct influence of aberrations of the projection optical system PL.

It is necessary to make the inclination angle $\theta_1$ of the scan direction 38a, 38b coincident with the inclination angle $\theta_2$ of the scan direction 39a, 39b with respect to the reference line 37a, 37b, but the scan direction 38a, 38b does not have to be perpendicular to the scan direction 39a, 39b. However, if they are perpendicular to each other, an arrangement of $\theta_1=\theta_2=45°$ is convenient in respect of data processing of position detection. In order to achieve the simplest structure of the alignment optical systems, the reference lines 37a, 37b both should be set as perpendicular to the moving direction of wafer W.

On the other hand, because the position detection of reticle R is made without interposition of the projection optical system PL, the detection accuracy for the diffraction grating marks 13, 14 on the reticle R does not depend upon the scan directions in particular. However, the alignment mechanism is arranged to measure amounts of positional deviation between the diffraction grating marks 13, 14 on the reticle R and the diffraction grating marks 17, 18 on the wafer W. Thus, the scan areas 35A, 35B of the diffraction grating marks 13, 14 are located in regions nearly conjugate with the scan areas 36A, 36B of the diffraction grating marks 17, 18 through the projection optical system. Also, the scan directions of the diffraction grating marks 13, 14 are set as conjugate with the scan directions 38a, 38b, 39a, 39b of the diffraction grating marks 17, 18. If the reference lines 37a, 37b are set in the X-axis direction and if the inclination angles $\theta_1$, $\theta_2$ of the scan directions 38a, 38b, 39a, 39b are set to 45°, the scan directions of the diffraction grating mark 13 are determined in two directions inclined at angles ±45° relative to the reference straight line passing the center of the scan area 35A of the diffraction grating mark 13 and the intersecting point between the surface of reticle R and the optical axis AX of projection optical system PL. Also, the scan directions of the diffraction grating mark 14 are determined in two directions inclined at angles ±45° relative to the reference straight line passing the center of the scan area 35B of the diffraction grating mark 14 and the intersecting point between the surface of reticle R and the optical axis AX of projection optical system PL.

Second Embodiment

Figure 12:
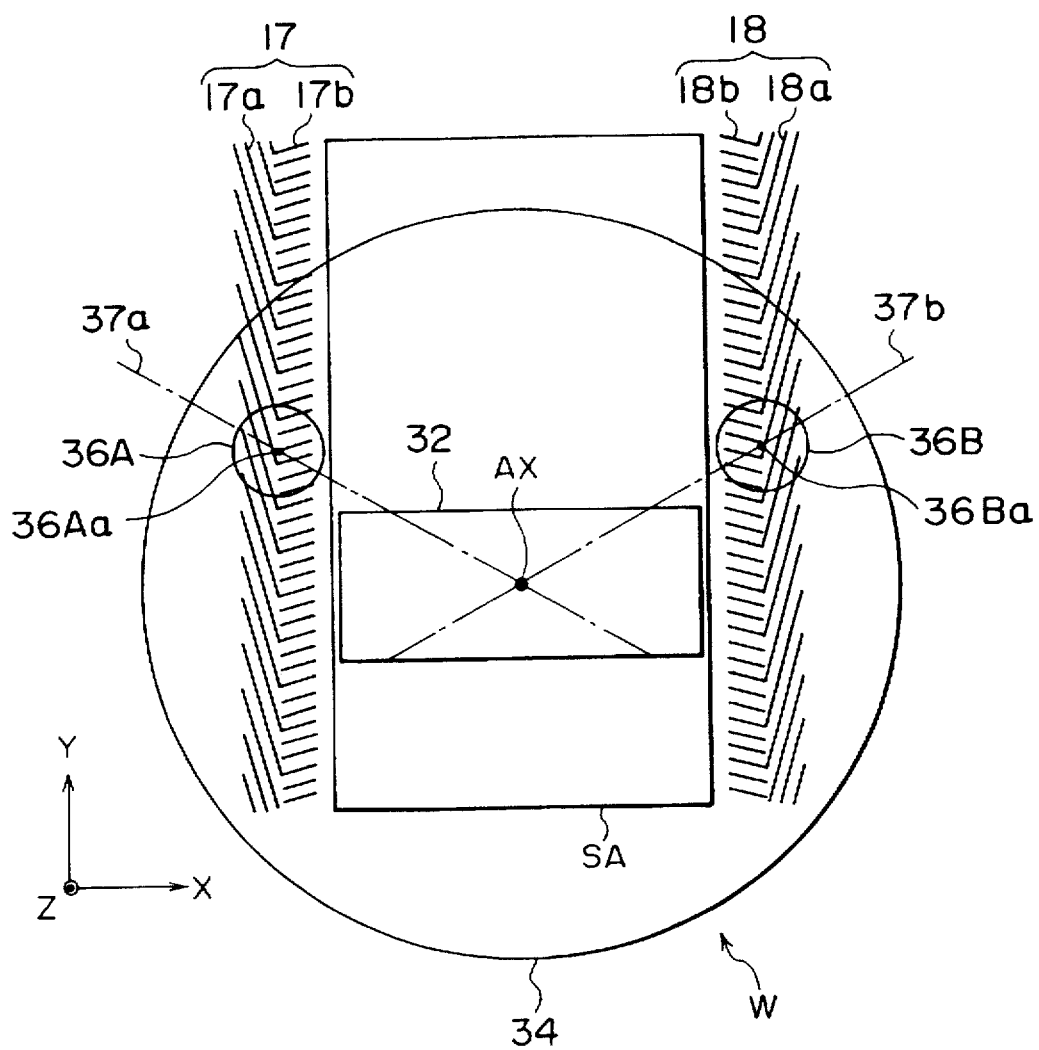
FIG. 12 is a plan view to show an arrangement in the XY plane, of the shot area and wafer marks formed on the wafer in the projection exposure apparatus of the second embodiment according to the present invention.

The present embodiment is a projection exposure apparatus constructed substantially in the same structure as the projection exposure apparatus of the first embodiment as described above. However, as shown in FIG. 12, the reference straight line 37a passing the intersecting point between the surface of wafer W and the optical axis AX of projection optical system PL and the center 36Aa of the scan area 35A is set as inclined at an angle not being 90° to the moving direction of wafer W. On the other hand, the reference straight line 37b passing the intersecting point between the surface of wafer W and the optical axis AX of projection optical system PL and the center 36Ba of the scan area 36B is set in axis symmetry with the reference straight line 37a with respect to the center line of shot area SA parallel to the moving direction of wafer W.

Here, a first scan straight line passing the center 36Aa of the scan area 36A and being parallel to the scan direction 38a and a second scan straight line passing the center 36Aa of the scan area 36A and being parallel to the scan direction 39a are arranged in axis symmetry with respect to the reference straight line 37a. Also, a first scan straight line passing the center 36Ba of the scan area 36B and being parallel to the scan direction 38b and a second scan straight line passing the center 36Ba of the scan area 36B and being parallel to the scan direction 39b are arranged in axis symmetry with respect to the reference straight line 37b.

As a result, when positions of the diffraction grating marks 17, 18 are detected through the projection optical system PL, a ratio between the m-directional component and the s-directional component included in the laser beam pair LB3 becomes equal to a ratio between the m-directional component and the s-directional component included in the laser beam pair LB4. This makes the influence on the two laser beam pairs LB3, LB4 coincident with each other, based on the aberration characteristics, normally different between in the m direction and in the s direction, in the projection optical system PL. Thus, detection accuracy of wafer W in the scan directions 38a, 38b of the laser beam pair LB3 becomes equal to detection accuracy of wafer W in the scan directions 39a, 39b of the laser beam pair LB4. Accordingly, particularly in the alignment mechanism of the LIA type, because the image magnifications of projection optical system PL are equal in the scan directions 38a, 38b, 39a, 39b, the cross angles of the two laser beam pairs LB3, LB4 can be determined with high accuracy, whereby accurate position detection can be made in each scan direction 38a, 38b, 39a, 39b of the diffraction grating mark 17, 18.

Third Embodiment

Figure 13:
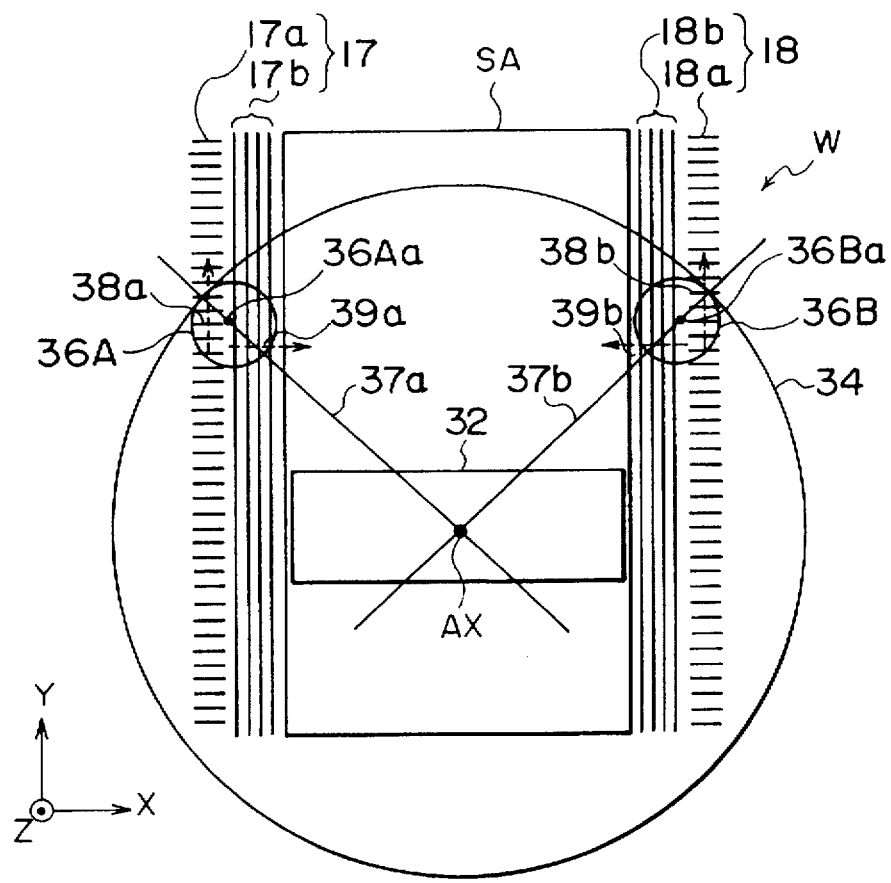
FIG. 13 is a plan view to show an arrangement in the XY plane, of the shot area and wafer marks formed on the wafer in the projection exposure apparatus of the third embodiment according to the present invention.

The present embodiment is a projection exposure apparatus constructed substantially in the same arrangement as the projection exposure apparatus of the second embodiment as described above. However, as shown in FIG. 13, the diffraction grating mark 17 on the wafer W is composed of a diffraction grating 17a the scan direction (pitch direction) 38a of which is set in the Y-axis direction and a diffraction grating 17b the scan direction 39a of which is set in the X-axis direction. On the other hand, the diffraction grating mark 18 is composed of a diffraction grating 18a the scan direction (pitch direction) 38b of which is set in the Y-axis direction and a diffraction grating 18b the scan direction 39b of which is set in the X-axis direction.

Here, the reference straight line 37a passing the intersecting point between the surface of wafer W and the optical axis AX of projection optical system PL and the center 36Aa of the scan area 36A is set as inclined at an angle 45° relative to the moving direction of wafer W. On the other hand, the reference straight line 37b passing the intersecting point between the surface of wafer W and the optical axis AX of projection optical system PL and the center 36Ba of the scan area 36B is set in axis symmetry with the reference straight line 37a with respect to the center line of shot area SA parallel to the moving direction of wafer W. Thus, the scan areas 36A, 36B deviate along the moving direction with respect to the intersecting point between the surface of wafer W and the optical axis AX of projection optical system PL.

As a result, when positions of the diffraction grating marks 17, 18 are detected through the projection optical system PL, a ratio between the m-directional component and the s-directional component included in the laser beam pair LB3 becomes equal to a ratio between the m-directional component and the s-directional component included in the laser beam pair LB4. This makes the influence on the two laser beam pairs LB3, LB4 coincident with each other, based on the aberration characteristics, normally different between in the m direction and in the s direction, in the projection optical system PL. Thus, detection accuracy of wafer W in the scan directions 38a, 38b of the laser beam pair LB3 becomes equal to detection accuracy of wafer W in the scan directions 39a, 39b of the laser beam pair LB4. Accordingly, particularly in the alignment mechanism of the LIA type, because the image magnifications of projection optical system PL are equal in the scan directions 38a, 38b, 39a, 39b, the cross angles of the two laser beam pairs LB3, LB4 can be determined with high accuracy, whereby accurate position detection can be made in each scan direction 38a, 38b, 39a, 39b of the diffraction grating mark 17, 18.

Fourth Embodiment

The present embodiment is an example in which the present invention is applied to a projection exposure apparatus of the one-shot exposure method, specifically the step-and-repeat method. Namely, the present embodiment is a stepper type projection exposure apparatus provided with an alignment mechanism of the TTR method and the LIA (double beam interference) type.

Figure 14:
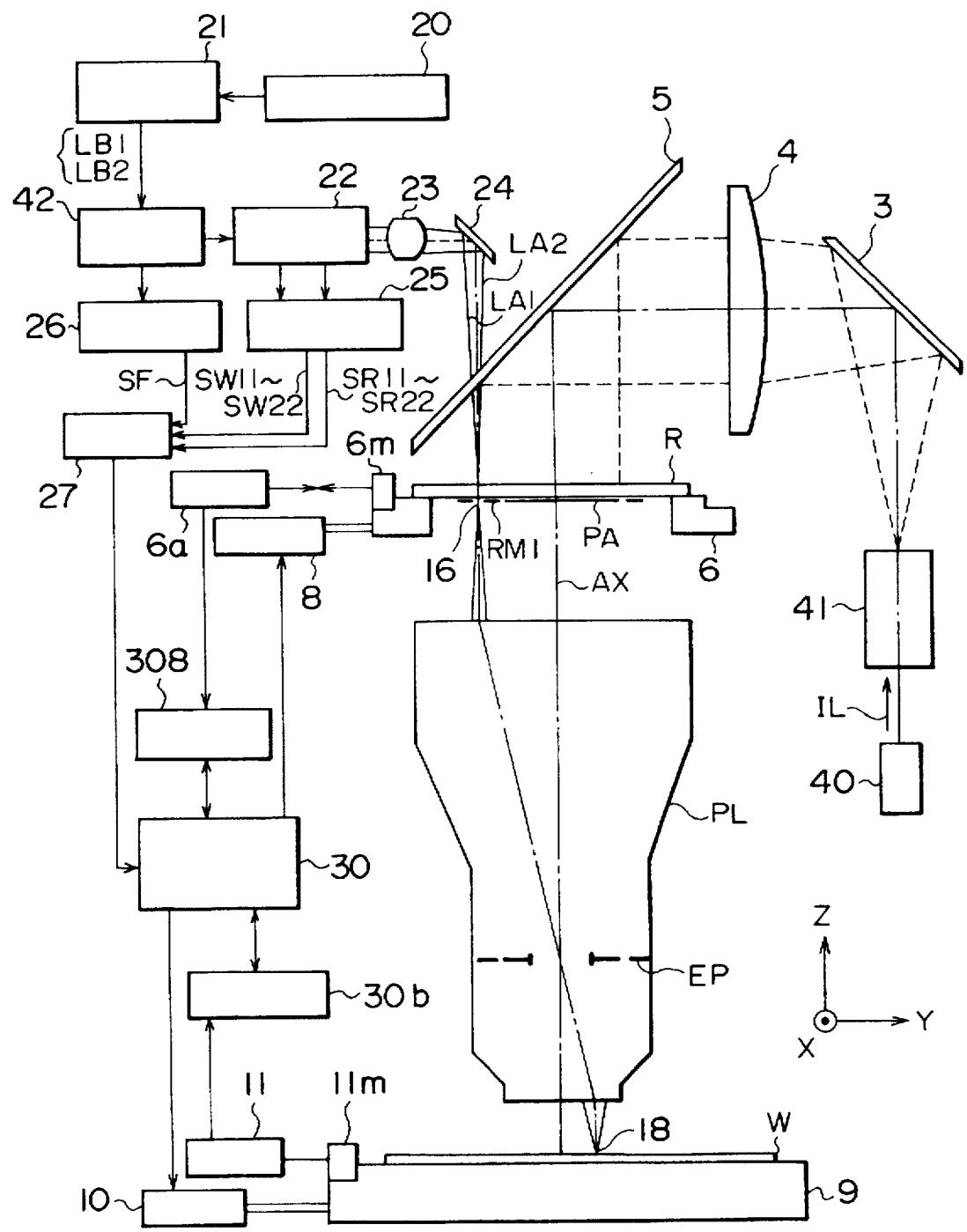
FIG. 14 is a side view to show the structure in the YZ plane, of the projection exposure apparatus of the fourth embodiment according to the present invention.

As shown in FIG. 14, the coordinate axes set for this projection exposure apparatus are the same as those for the first embodiment as described previously. Exposure light IL in the wavelength region to which a photoresist layer is sensitive, such as the i-line (wavelength 365 nm) or the g-line, emitted from an exposure light source system 40 consisting of a super-high pressure mercury lamp and a collector mirror etc., is incident into an illuminance distribution equalizing optical system 41 including an optical integrator such as a fly's eye lens, etc. The illumination light for exposure IL may be an emission line from another discharge lamp, excimer laser light such as ArF excimer laser or KrF excimer laser, or a harmonic of YAG laser, etc.

The exposure light IL, after subjected to equalization of illuminance distribution, reduction of speckles, etc. by the illuminance distribution equalizing optical system 41, is guided via a mirror 3 and a main condenser lens 4 to reach a dichroic mirror 5, and the exposure light reflected vertically downward by the dichroic mirror 5 illuminates the pattern area PA of reticle R in a uniform illuminance distribution. The dichroic mirror 5 is inclined at an angle of inclination of 45° above the reticle R, has a reflectivity of not less than 90% for the wavelength of exposure light IL, and has a transmittance of not less than 50% for the wavelength of alignment light (normally longer than that of the exposure light).

A circuit pattern of a transferred object is formed in the pattern area PA in the pattern surface (bottom face) of reticle R. The exposure light IL having passed the pattern area PA of reticle R is then incident into the bitelecentric projection optical system PL, and the projection optical system PL projects (focuses) a demagnified image of the circuit pattern of reticle R at a predetermined magnification $\beta$ (where $\beta$ is for example ⅕) in a superimposed manner on one shot area on the wafer W on the surface of which a photoresist layer is formed. The projection optical system PL is well corrected for chromatic aberration for the wavelength of exposure light IL (exposure wavelength), and the reticle R and wafer W are arranged so as to be conjugate with each other under the exposure wavelength.

Figure 15:
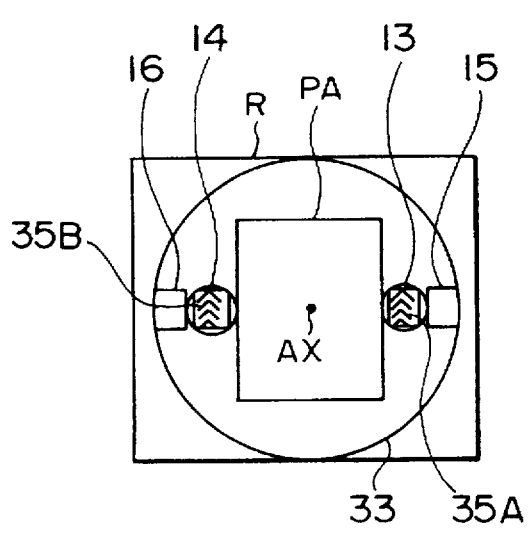
FIG. 15 is a plan view to show an arrangement in the XY plane, of the pattern area and reticle marks of reticle in the projection exposure apparatus or FIG. 14.

An optically transparent window (reticle window) for alignment 16 is formed in a light-shielding band made from a chromium layer in a constant width surrounding the pattern area PA of reticle R. On the other hand, a diffraction grating mark 18 is provided next to the shot area SA to be exposed on the wafer W. As shown in FIG. 15, diffraction grating marks 13, 14 consisting of inverse V-shaped patterns are formed on either side of the pattern area PA of reticle R. Outside these diffraction grating marks 13, 14, reticle windows 15, 16 for transmitting the laser beam are formed so as to be conjugate with the diffraction grating marks 17, 18 on the wafer W through the projection optical system. Scan areas 35A and 35B of the alignment mechanism of the LIA type are set in the maximum effective transfer area 33 of reticle R conjugate with the maximum effective exposure field 34 of projection optical system PL. Position detection of diffraction grating mark 13 is carried out in the scan area 35A, while the position detection of diffraction grating mark 14 in the scan area 35B.

As shown in FIG. 14, the reticle R is mounted on a reticle stage 6, and positioning is made so that the center point of the pattern area PA of reticle R coincides with the optical axis AX of projection optical system PL. The reticle stage 6 is arranged to two-dimensionally move and to finely rotate in a horizontal plane (XY plane) by a drive motor 8, and a moving mirror 6m for reflecting a laser beam from a laser beam interferometric length meter (hereinafter referred to as "laser interferometer") 6a is fixed to an edge of reticle stage 6. The laser interferometer 6a constantly detects X-directional and Y-directional positions of reticle R at a resolution for example of about 0.01 μm. Also, the laser interferometer 6a also detects a rotational angle of reticle R, and detection results by the interferometer 6a are supplied through a servo measuring unit 308 to a main control unit 30 for totally controlling the operation of the entire apparatus. Initial setting of reticle R is carried out by finely moving the reticle stage 6, based on mark detection signals from a reticle alignment system (not shown) for photoelectrically detecting alignment marks around the pattern area PA.

Figure 16:
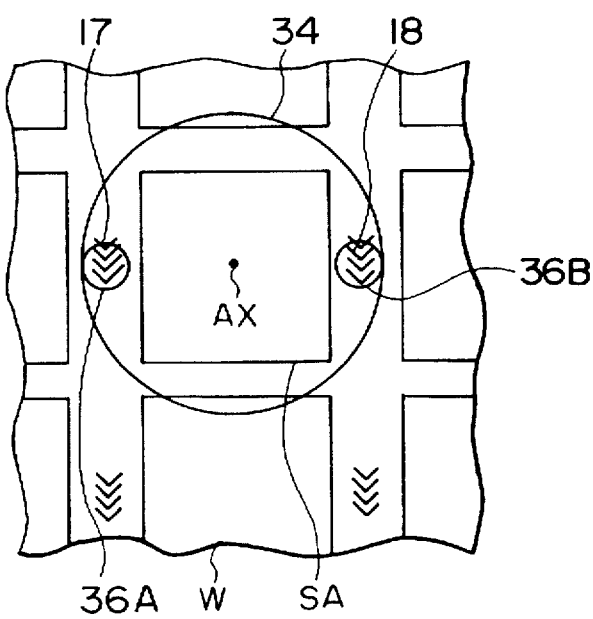
FIG. 16 is a plan view to show an arrangement in the XY plane, of the shot area and wafer marks of wafer in the projection exposure apparatus of FIG. 14.

On the other hand, as shown in FIG. 16, diffraction grating marks 17, 18 consisting of V-shaped patterns are formed on either side of shot area SA on the wafer W. Scan areas 36A, 36B of the alignment mechanism of the LIA type are set outside an actual exposure area in the maximum effective exposure field 34 of projection optical system PL. Position detection of diffraction grating mark 17 is carried out in the scan area 36A while position detection of diffraction grating mark 18 in the detection area 36B.

As shown in FIG. 14, the wafer W is mounted on a wafer stage 9 moving in the X direction and the Y direction by a drive motor 10, and after completion of transfer exposure of the pattern image of reticle R in one shot area on the wafer W, the wafer stage 9 is stepped to set a next shot area of wafer W at the exposure position, thus performing exposures in the step-and-repeat method. The wafer stage 9 is provided with a Z stage for positioning the wafer W in the Z direction and a rotation stage for rotating the wafer W. A moving mirror 11m for reflecting a laser beam from a laser interferometer 11 is fixed to an edge of the wafer stage 9, and the laser interferometer 11 always detects X-directional and Y-directional positions of the wafer stage 9 at a resolution for example of about 0.01 μm. The laser interferometer 11 also detects a rotational angle of the wafer stage 9, and detection results by the laser interferometer 11 are supplied through a servo measuring unit 306 to the main control unit 30.

In the present embodiment, there are alignment optical systems of the LIA type for detecting positional deviation amounts in the pitch directions (scan directions), of the diffraction grating marks as alignment marks on the reticle R and on the wafer W by the TTR method, provided above the reticle R. Although FIG. 14 shows only one alignment optical system, the apparatus includes four alignment optical systems in fact.

As shown in FIG. 14, a coherent and linearly polarized laser beam emitted from a laser light source 20 such as Ne—Ne laser, He-Cd laser, or Ar ion laser, is incident into a double-beam-forming frequency shifter 21, where the laser beam is split into two laser beams L1, L2 having a frequency difference Δf between them. This frequency difference Δf has an upper limit determined by frequency response of a photoelectric detector for receiving interference light emergent from the alignment marks. For example, if the photoelectric detector is a semiconductor sensor such as a photodiode, practical frequency difference Δf is preferably not more than 100 kHz, for example about 50 kHz. If the photoelectric detector is a photomultiplier tube (photomultiplier), the frequency difference Δf can be set at a relatively high frequency.

Now, the two laser beams LB1, LB2 are split into two laser beam pairs LB3, LB4 for each alignment optical system by a beam splitting optical system 42. The beam splitting optical system 42 further produces a pair of laser beams as reference beams, and these reference beams interfere with each other in a reference detecting system 26. Beat interference light made by this interference is photoelectrically converted into a reference signal SF by a photoelectric detector in the reference detecting system 26. This reference signal SF is supplied to a phase difference measuring unit 27, and the phase difference measuring unit 27 detects phase differences between reticle detection signals SR11 to SR22 corresponding to the diffraction grating marks on the reticle R side and wafer detection signals SW11 to SW22 corresponding to the diffraction grating marks on the wafer W side, using the reference signal SF as a reference.

Also, the beam splitting optical system 42 generates two laser beam pairs LB3, LB4 for each of the four alignment optical systems. Here, the transmission-reception separating optical system 22, objective lens 23, and vertical illumination mirror 23 are illustrated only for one of the four alignment optical systems. The two laser beam pairs LB3, LB4 incident into the transmission-reception separating optical system 22 are incident into the objective lens 23.

On this occasion, the two laser beam pairs LB3, LB4 are incident into the objective lens 23 so as to be eccentric in symmetry with respect to a straight line normally crossing the optical axis of the objective lens 23 and so as to be eccentric in the same direction perpendicular to the direction of the eccentricity, respectively. The latter eccentricity effects the telecentricity breaking as detailed later. The two laser beam pairs LB3, LB4 emergent from the objective lens 23 are reflected by the vertical illumination mirror 24, pass through the dichromic mirror 5, and intersect with each other as parallel beams at the focal point of objective lens 23 in the reticle window 16 in the pattern surface of reticle R. The two laser beam pairs LB3, LB4 having passed the reticle window 16 are incident at a predetermined cross angle on the diffraction grating mark 18 on the wafer W through the projection optical system PL.

Here, the projection optical system PL is corrected for various aberrations for the exposure light while there is a possibility that chromatic aberration remains for the two laser beam pairs LB3, LB4. For such cases of chromatic aberration remaining, an optical path controlling member for deflecting optical paths of the laser beam pairs LB3, LB4 so as to correct chromatic aberration is provided at intersecting points between the pupil plane EP of projection optical system PL and the optical paths of laser beam pairs LB3, LB4. By this, the laser beam pairs LB3, LB4 intersect on the diffraction grating mark 18 on the wafer W through the projection optical system PL.

The diffraction gratings 17, 18 are formed substantially in the same manner as in the first embodiment as described previously. Here, in one alignment optical system, two laser beams LB11, LB21 constituting the laser beam pair LB3 cross each other in symmetry at respective incident angles $\theta_{in}$ along the scan direction 38a of diffraction grating 17a, whereby the diffraction grating 17a outputs + first order diffracted light LB11 (+1) and − first order diffracted light LB21 (−1) constituting beat interference light LB5. However, because based on the so-called telecentricity breaking, the laser beam pair LB3 is incident into the diffraction grating 17a so as to be inclined relative to the non-scan direction perpendicular to the scan direction 38a in the surface of wafer W, the beat interference light LB5 is emergent in symmetry with the laser beam pair LB3 with respect to the normal line to the surface of wafer W in a plane perpendicular to the scan direction 38a.

Also, two laser beams LB12, LB22 constituting the laser beam pair LB4 cross each other in symmetry at respective incident angles $\theta_{in}$ along the scan direction 39a of diffraction grating 17b, whereby the diffraction grating 17b outputs + first order diffracted light LB12 (+1) and − first order diffracted light LB22 (−1) constituting beat interference light LB6. However, because, based on the telecentricity breaking, the laser beam pair LB4 is incident to the diffraction grating 17b so as to be inclined relative to the non-scan direction perpendicular to the scan direction 39a in the surface of wafer W, the beat interference light LB6 is emergent in symmetry with the laser beam pair LB4 with respect to the normal line to the surface of wafer W in a plane perpendicular to the scan direction 39a.

In another alignment optical system, two laser beams LB11, LB21 constituting the laser beam pair LB3 cross each other in symmetry at respective incident angles $\theta_{in}$ along the scan direction 38b of the diffraction grating 18a, whereby the diffraction grating 18a outputs + first order diffracted light LB11 (+1) and − first order diffracted light LB21 (−1) constituting beat interference light LB5. However, because, based on the telecentricity breaking, the laser beam pair LB3 is incident to the diffraction grating 18a so as to be inclined relative to the non-scan direction perpendicular to the scan direction 38b in the surface of wafer W, the beat interference light LB5 is emergent in symmetry with the laser beam pair LB3 with respect to the normal line to the surface of wafer W in a plane perpendicular to the scan direction 38b.

Also, two laser beams LB12, LB22 constituting the laser beam pair LB4 cross each other in symmetry at respective incident angles $\theta_{in}$ along the scan direction 39b of the diffraction grating 18b, whereby the diffraction grating 18b outputs + first order diffracted light LB12 (+1) and − first order diffracted light LB22 (−1) constituting the beat interference light LB6. However, because, based on the telecentricity breaking, the laser beam pair LB4 is incident to the diffraction grating 18b so as to be inclined relative to the non-scan direction perpendicular to the scan direction 39b in the surface of wafer W, the beat interference light LB6 is emergent in symmetry with the laser beam pair LB4 with respect to the normal line to the surface of wafer W in a plane perpendicular to the scan direction 39b.

As shown in FIG. 14, the two beat interference light beams LB5, LB6 are guided via the projection optical system PL, the reticle window 16 of reticle R, the dichroic mirror 5, the vertical illumination mirror 24, the objective 23, and the transmission-reception separating optical system 22 to a first photoelectric detector in the photoelectric detecting unit 25, and the first photoelectric detector outputs sinusoidal wafer detection signals SW11, SW22.

The two laser beam pairs LB3, LB4, which are supplied from the transmission-reception separating optical system 22 to another alignment optical system and which are incident into the objective 23 as eccentric in symmetry with respect to the optical axis of the objective 23, are incident at a predetermined cross angle upon the diffraction grating mark 18 of wafer W through the projection optical system PL. By this, the photoelectric detecting unit 25 photoelectrically converts the two beat interference light beams LB5, LB6 emergent from the diffraction grating mark 18, thereby outputting sinusoidal wafer detection signals SW21, SW22.

Also, the two laser beam pairs LB3, LB4, which are supplied from the transmission-reception separating optical system 22 to another alignment optical system and which are incident into the objective 23 as eccentric in symmetry with respect to the optical axis of the objective 23, are incident at a predetermined cross angle upon the diffraction grating mark 13 adjacent to the window 15 of reticle R conjugate with the diffraction grating mark 17 of wafer W through the projection optical system PL. By this, the photoelectric detecting unit 25 photoelectrically converts the two beat interference light beams LB5, LB6 emergent from the diffraction grating mark 13, thereby outputting sinusoidal reticle detection signals SR11, SR21.

Further, the two laser beam pairs LB3, LB4, which are supplied from the transmission-reception separating optical system 22 to the other alignment optical system and which are incident into the objective 23 as eccentric in symmetry with respect to the optical axis of the objective 23, are incident at a predetermined cross angle on the diffraction grating mark 14 adjacent to the window 16 of reticle R conjugate with the diffraction grating mark 18 of wafer W through the projection optical system PL. By this, the photoelectric detecting unit 25 photoelectrically converts the two beat interference light beams LB5, LB6 emergent from the diffraction grating mark 13, thereby outputting sinusoidal reticle detection signals SR12, SR22.

These four types of wafer detection signals SW11 to SW22 and four types of reticle detection signals SR11 to SR22 are input as beat ac signals having a same frequency into a phase difference measuring unit 27. The phase difference measuring unit 27 detects a phase difference $\Delta\Phi11$ between the wafer detection signal SW11 and the reticle detection signal SR11, thereby calculating an amount of relative positional deviation between the wafer W and the reticle R, specifically between a position of wafer W along the scan direction 38a of diffraction grating mark 17 and a position of reticle R along the scan direction of diffraction grating mark 13 conjugate with the scan direction 38a through the projection optical system PL. The phase difference measuring unit 27 detects a chase difference $\Delta\Phi21$ between the wafer detection signal SW21 and the reticle detection signal SR21, thereby calculating an amount of relative positional deviation between the wafer W and the reticle R, specifically between a position of wafer W along the scan direction 39a of diffraction grating mark 17 and a position of reticle R along the scan direction of diffraction grating mark 13 conjugate with the scan direction 39a through the projection optical system PL.

Further, the phase difference measuring unit 27 detects a phase difference $\Delta\Phi12$ between the wafer detection signal SW12 and the reticle detection signal SR12, thereby calculating an amount of relative positional deviation between the wafer W and the reticle R, specifically between a position of wafer W along the scan direction 38a of diffraction grating mark 18 and a position of reticle R along the scan direction of diffraction grating mark 14 conjugate with the scan direction 38a through the projection optical system PL. The phase difference measuring unit 27 detects a phase difference $\Delta\Phi22$ between the wafer detection signal SW22 and the reticle detection signal SR22, thereby calculating an amount of relative positional deviation between the wafer W and the reticle R, specifically between a position of wafer W along the scan direction 39a of diffraction grating mark 18 and a position of reticle R along the scan direction of diffraction grating mark 14 conjugate with the scan direction 39a through the projection optical system PL.

The thus calculated amounts of relative positional deviation between the wafer W and the reticle R are supplied to the main control unit 30. This main control unit 30 is constructed to include a servo controlling means, and successively outputs correction values to either one of drive controlling units 9, 28, based on coordinate values supplied from the servo measuring units 306, 308, thereby setting the amounts of relative positional deviation between the wafer W and the reticle R to a predetermined value. The phase difference measuring unit 27 can detect phase differences normally in the range of $-180°$ to $+180°$. The upper limit and lower limit of the phase differences correspond to ($\frac{1}{2}$) PW1 and ($\frac{1}{4}$) PW1, respectively.

The center of an illumination area of the two laser beams LB11, LB21 incident on the diffraction grating 17a and the center of an illumination area of the two laser beams LB12, LB22 incident on the diffraction grating 17b are almost coincident with the center 36Aa of the scan area 36A of the alignment optical system. The center 36Aa of the scan area 36A is an intersecting point between a first scan straight line parallel to the scan direction 38a in the surface of wafer W and a second scan straight line parallel to the scan direction 39a in the surface of wafer W.

The first and second scan straight lines are set in axis symmetry with respect to a reference straight line 37a passing the intersecting point between the surface of wafer W and the optical axis AX of projection optical system PL, and the center 36Aa of the scan area 36A. Namely, a clockwise angle $\theta_1$ between the first scan line and the reference line 37a is coincident with a counterclockwise angle $\theta_2$ between the second scan line and the reference line 37a. In the diffraction grating mark 17, the pitch PW1 in the scan direction 38a may be set to be different from the pitch PW2 in the scan direction 39a.

On the other hand, the diffraction grating 18 on the wafer W is composed of a diffraction grating 18a aligned along the scan direction 38b, and a diffraction grating 18b aligned along the scan direction 39b. The center of an illumination area of the two laser beams LB11, LB21 incident on the diffraction grating 18a and the center of an illumination area of the two laser beams LB12, LB22 incident on the diffraction grating 18b are approximately coincident with the center 36Ba of the scan area 36B of the alignment optical system. The center 36Ba of the scan area 36B is an intersecting point between a third scan straight line parallel to the scan direction 38b in the surface of wafer W and a fourth scan straight line parallel to the scan direction 39b in the surface of wafer W.

Then the third and fourth scan straight lines are set in axis symmetry with respect to a reference straight line 37b passing the intersecting point between the surface of wafer W and the optical axis AX of projection optical system PL, and the center 36Ba of the scan area 36B. Namely, a clockwise angle $\theta_1$ between the third scan line and the reference line 37b is coincident with a counterclockwise angle $\theta_2$ between the fourth scan line and the reference line 37b. In the diffraction grating mark 18, the pitch PW1 in the scan direction 38b may be set to be different from the pitch PW2 in the scan direction 39b.

In the present embodiment, the Y-axis direction is set as the m direction of projection optical system PL, and the X-axis direction as the s direction of projection optical system PL. In this case, because the center 36Aa of the scan area 36A of the diffraction grating mark 17 is shifted in the +X-axis direction relative to the optical axis AX of projection optical system PL, the position of the center 36Aa can be regarded as a kind of image height. Then, the s direction of the projection optical system PL can also be a direction of deviation of image height of the diffraction grating mark 17. On the other hand, because the center 36Ba of the scan area 36B of the diffraction grating mark 18 is shifted in the −X-axis direction relative to the optical axis AX of projection optical system PL, the position of the center 36Ba can be regarded as a kind of image height. Then, the s direction of the projection optical system PL can also be regarded as a direction of deviation of image height of the diffraction grating mark 18.

As a result, when positions of the diffraction grating marks 17, 18 are detected through the projection optical system PL, a ratio between the m-directional component and the s-directional component included in the laser beam pair LB3 becomes equal to a ratio between the m-directional component and the s-directional component included in the laser beam pair LB4. This makes the influence on the two laser beam pairs LB3, LB4 coincident with each other, based on the aberration characteristics, normally different between in the m direction and in the s direction, in the projection optical system PL. Thus, detection accuracy of wafer W in correspondence to the scan directions 38a, 38b of the laser beam pair LB3 becomes equal to detection accuracy of wafer W in correspondence to the scan directions 39a, 39b of the laser beam pair LB4. Accordingly, particularly in the alignment mechanism of the LIA type, because the image magnifications of projection optical system PL are equal in the scan directions 38a, 38b, 39a, 39b, the cross angles of the two laser beam pairs LB3, LB4 can be determined with high accuracy, whereby accurate position detection can be made in each scan direction 38a, 38b, 39a, 39b of the diffraction grating mark 17, 18.

If the scan directions 38a, 38b, 39a, 39b were set as to be parallel (in the s direction) and perpendicular (in the m direction) to the reference lines 37a, 37b, the apparatus would be subjected to direct influence of aberrations of projection optical system PL, particularly, a difference of projection magnifications would become maximum between in the m direction and in the s direction.

It is necessary that the inclination angle $\theta_1$ of the scan direction 38a, 38b be made coincident with the inclination angle $\theta_2$ of the scan direction 39a, 39b relative to the reference line 37a, 37b, but the scan direction 38a, 38b does not have to be perpendicular to the scan direction 39a, 39b. However, if they are perpendicular to each other, the arrangement of $\theta_1=\theta_2=45°$ is convenient in respect of data processing of position detection. In order to achieve the simplest structure of the alignment optical systems, the reference lines 37a, 37b both should be set perpendicular to the moving direction of wafer W.

On the other hand, because the position detection of reticle R is made without interposition of the projection optical system PL, the detection accuracy for the diffraction grating marks 13, 14 on the reticle R does not depend upon the scan directions in particular. However, the alignment mechanism is arranged to measure amounts of positional deviation between the diffraction grating marks 13, 14 on the reticle R and the diffraction grating marks 17, 18 on the wafer W. Thus, the scan areas 35A, 35B of the diffraction grating marks 13, 14 are located in regions nearly conjugate with the scan areas 36A, 36B of the diffraction grating marks 17, 18 through the projection optical system. Also, the scan directions of the diffraction grating marks 13, 14 are set as conjugate with the scan directions 38a, 38b, 39a, 39b of the diffraction grating marks 17, 18. If the reference lines 37a, 37b are set in the X-axis direction and if the inclination angles $\theta_1$, $\theta_2$ of the scan directions 38a, 38b, 39a, 39b are set to 45°, the scan directions of the diffraction grating mark 13 are determined in two directions inclined at angles ±45° relative to the reference straight line passing the center of the scan area 35A of the diffraction grating mark 13 and the intersecting point between the surface of reticle R and the optical axis AX of projection optical system PL. Also, the scan directions of the diffraction grating mark 13 are determined in two directions inclined at angles ±45° relative to the reference straight line passing the center of the scan area 35B of the diffraction grating mark 14 and the intersecting point between the surface of reticle R and the optical axis AX of projection optical system PL.

Figure 17:
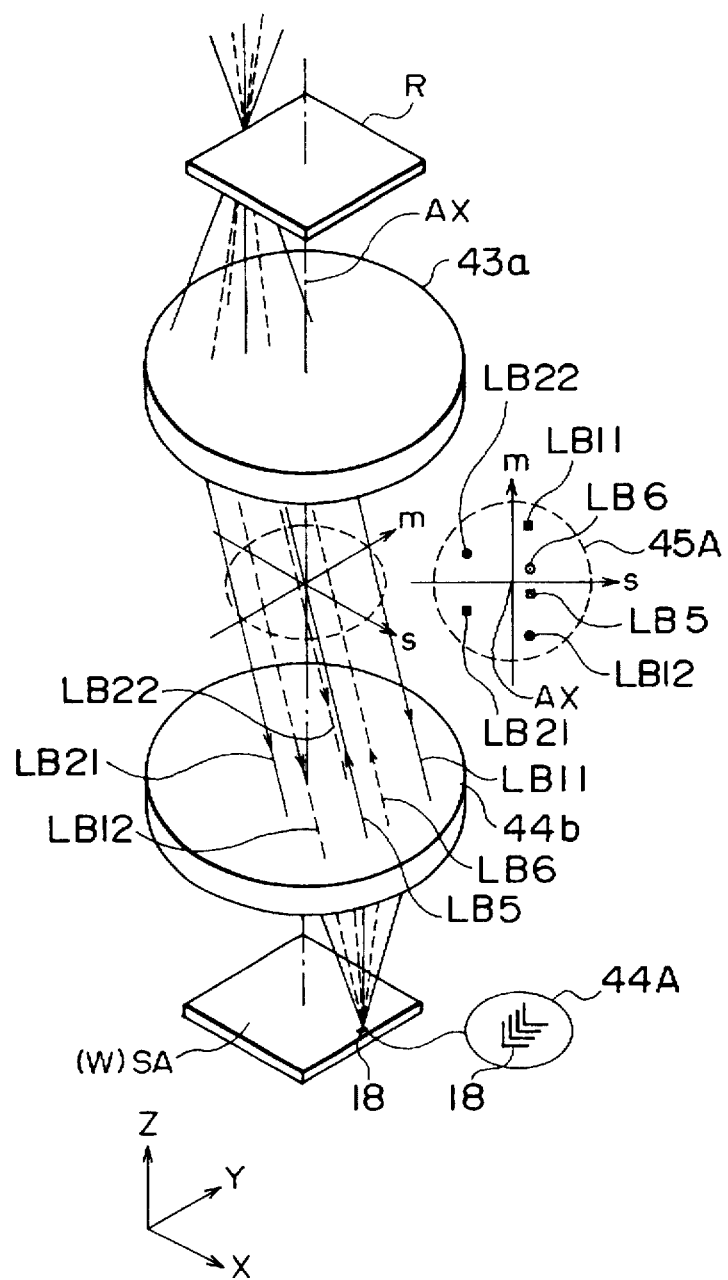
FIG. 17 is a perspective view to show optical paths of alignment light in the projection optical system in the projection exposure apparatus of FIG. 14.

In FIG. 17 to FIG. 19, the projection optical system PL is illustrated as constructed of a first lens group 43a and a second lens group 43b, and the pupil plane thereof is set between these first lens group 43a and second lens group 43b. Also, each of enlarged drawings 44A to 44C in a circle surrounded by the solid line shows an enlarged diffraction grating mark 18. Further, each of plan views 45A to 45C in a circle surrounded by the dotted line shows positions of two laser beam pairs LB3, LB4 and two beat interference light beams LB5, LB6 passing the pupil plane EP of projection optical system PL or the Fourier transform pattern for the pattern surface of reticle R.

If telecentricity breaking were not effected on the alignment mechanism, as shown in FIG. 18, the two laser beams LB11, LB21 constituting the laser beam pair LB3, emergent from one alignment optical system and passing through the reticle R, are incident through the projection optical system PL on one diffraction grating 18a in the diffraction grating mark 18. On this occasion, a plane including the laser beams LB11, LB21 becomes perpendicular to the surface of wafer W. Thus, + first order diffracted light LB11 (+1) and − first order diffracted light LB21 (−1) constituting the beat interference light LB5 is emergent from the diffraction grating 18a along the direction of the normal line to the surface of wafer W (or in the Z-axis direction).

Also, two laser beams LB12, LB22 constituting the laser beam pair LB4, emergent from the same alignment optical system and passing through the reticle R, are incident through the projection optical system PL on the other diffraction grating 18b in the diffraction grating mark 18. On this occasion, a plane including the laser beams LB12, LB22 becomes perpendicular to the surface of wafer W. Thus, + first order diffracted light LB12 (+1) and − first order diffracted light LB22 (−1) constituting the beat interference light LB6 is emergent from the diffraction grating 18b along the direction of the normal line to the surface of wafer W (or in the Z-axis direction).

An intersecting line between the plane including the laser beams LB11, LB21 and the surface of wafer W is parallel to the scan direction 38a of the diffraction grating 18a, while an intersecting line between the plane including the other laser beams LB11, LB22 and the surface of wafer W is parallel to the san direction 39a of the diffraction grating 18b. Those scan directions 38a, 39a are set in axis symmetry with respect to a straight line, i.e., a reference straight line passing the intersecting point between the surface of wafer W and the optical axis AX of projection optical system PL and being parallel to the s direction (X-axis direction).

By this, on the pupil plane EP of projection optical system PL composed of the first lens group 43a and second lens group 43b, as shown in the plan view 45B of Fourier transform pattern, passing positions of the laser beams LB11, LB21 and passing positions of the laser beams LB12, LB22 are in axis symmetry both with respect to a first auxiliary reference straight line passing the intersecting point between the pupil plane EP and the optical axis AX and being parallel to the s direction and with respect to a second auxiliary reference straight line passing the intersecting point between the pupil plane EP and the optical axis AX and being parallel to the m direction. In the following description, axial symmetry with respect to the first auxiliary reference line will be called as symmetry in the m direction, and axial symmetry with respect to the second auxiliary reference line as symmetry in the s direction. Accordingly, the laser beams LB11, LB21 and laser beams LB21, LB22 have both the symmetry in the m direction and the symmetry in the s direction. In this case, the symmetry in the m direction and the symmetry in the s direction on the pupil plane EP of projection optical system PL also hold for the laser beam pairs LB3, LB4 as to the diffraction grating mark 17.

As a result, when the positions of diffraction grating mark 17, 18 are detected through the projection optical system PL, the detection accuracy of wafer W in the scan directions 38a, 38b of the laser beam pair LB3 becomes equal to the detection accuracy of wafer W in the scan directions 39a, 39b of the laser beam pair LB4.

However, when the laser beam pair LB3 is incident on each of the diffraction grating marks 17, 18, each of zeroth order light beams (regularly reflected light beams) of the two laser beams LB11, LB21 constituting the laser beam pair LB3 is emergent in the incident direction of the counterpart beam, and ± second order diffracted light of the two laser beams LB11, LB21 is emergent in the respective incident directions thereof. Since such zeroth order light and ± second order diffracted light, appearing as superimposed at least one of laser beams LB11, LB21, is difficult to separate and remove as unnecessary light, they will become stray light that could negatively affect the detection accuracy of wafer W. When the laser beam pair LB4 is incident on each of the diffraction grating marks 17, 18, the zeroth order light and ± second order diffracted light, appearing as superimposed on at least one of the laser beams LB12, LB22, is difficult to separate and remove as unnecessary light, which could negatively affect the detection accuracy of wafer W as stray light.

The diffraction grating mark 17, 18 is constructed as a two-dimensional diffraction grating mark having two pitch directions (scan directions) different from each other, or a diffraction grating mark in which two one-dimensional diffraction grating marks having two respective pitch directions different from each other are arranged as adjacent to each other. In such a diffraction grating mark, the beat diffracted light beams LB5, LB6 emergent in parallel from two measuring points, which are close to each other in the two mutually different pitch directions, are difficult to completely separate and detect, resulting in mixture with each other, which could negatively affect the detection accuracy of wafer W.

As shown in FIG. 19, if simple telecentricity breaking were effected on the alignment mechanism, in the diffraction grating mark 18 the plane including the laser beams LB11, LB21 constituting the laser beam pair LB3 is inclined at a predetermined angle in the non-scan direction perpendicular to the scan direction 38b of diffraction grating 18a and the plane including the laser beams LB12, LB22 constituting the laser beam pair LB4 is inclined at the same angle in the non-scan direction perpendicular to the scan direction 39b of diffraction grating 18b. Accordingly, on the pupil plane EP of projection optical system PL, as shown in the plan view 45C of Fourier transform pattern, passing positions of the laser beams LB11, LB21 and passing positions of the laser beams LB21, LB22 are shifted by a same amount along two mutually orthogonal directions as inclined at angles 45° relative to the m direction and the s direction as compared with the case without telecentricity breaking for the alignment mechanism. Also, a passing position of beat interference light LB5 and a passing position of beat interference light LB6 are shifted by a same amount along the two mutually orthogonal directions as inclined at angles 45° relative to the m direction and the s direction as compared with the case without telecentricity breaking for the alignment mechanism.

In this case, similar shift occurs on the pupil plane EP of projection optical system PL for the laser beam pairs LB3, LB4 and the beat interference light beams LB5, LB6 as to the diffraction grating mark 17. As a result, the laser beams LB3, LB4 and the beat interference light beams LB5; LB6 are spatially separated from each other on the pupil plane EP of projection optical system PL. Thus, the zeroth order light and ± second order diffracted light appearing as superimposed on at least one of the laser beams LB11, LB21 can be separated and removed as unnecessary light, so that the beat interference light beams LB5, LB6 can be perfectly separated and detected. However, because shift amounts of the respective laser beams LB11 to LB22 on the pupil plane EP of projection optical system PL are arranged to be equal in the corresponding non-scan directions, the symmetry in the s direction is maintained, but the symmetry in the m direction becomes absent. Namely, the axial symmetry is destroyed with respect to the first auxiliary reference line. Thus, when the positions of the diffraction grating marks 17, 18 are detected through the projection optical system PL, an imbalance would arise between the detection accuracy of wafer W in the scan directions 38a, 38b of the laser beam pair LB3 and the detection accuracy of wafer W in the scan directions 39a, 39b of the laser beam LB4.

As shown in FIG. 17, when the telecentricity breaking is effected on the alignment optical system as also maintaining the symmetry in the m direction for the passing positions of the laser beams LB3, LB4 on the pupil plane EP of projection optical system PL, as shown in the plan view 45A of Fourier transform pattern, passing positions of the two laser beams LB11, LB21 and passing positions of the two laser beams LB12, LB22 are set in axis symmetry with respect to the first auxiliary reference straight line on the pupil plane EP of projection optical system PL as to the alignment optical system corresponding to the diffraction grating mark 18. Thus, a passing position of the beat interference light LB5 and a passing position of the beat interference light LB6 are set similarly in axis symmetry with respect to the first auxiliary reference line. Namely, the laser beam pairs LB3, LB4 and the beat interference light beams LB5, LB6 have symmetry in the m direction. Here, the first auxiliary reference straight line is a straight line passing the intersecting point between the pupil plane EP of projection optical system PL and the optical axis AX and being parallel to the s direction. The first auxiliary reference line is parallel to the reference straight line 37b as a symmetry axis for the two scan directions 38b, 39b of the diffraction grating mark 18. In this case, the symmetry in the m direction on the pupil plane EP of projection optical system PL also holds for the laser beams LB3, LB4 and the beat interference light beams LB5, LB6 as to the diffraction grating mark 18.

As a result, because the laser beams LB3, LB4 and the beat interference light beams LB5, LB6 are spatially separated on the pupil plane EP of projection optical system PL, the zeroth order light and ± second order light appearing as superimposed on at least one of the laser beams LB11, LB21 can be separated and removed as unnecessary light, and the beat diffracted light LB5, LB6 can be perfectly separated and detected. In addition, when positions of the diffraction grating marks 17, 18 are detected through the projection optical system PL, the detection accuracy of wafer W in the scan directions 38a, 38b of the laser beam pair LB3 becomes equal to the detection accuracy of wafer W in the scan directions 39a, 39b of the laser beam pair LB4. Accordingly, particularly in the alignment mechanism of the LIA type, because image magnifications of projection optical system PL are equal to each other as to the scan directions 38a, 38b, 39a, 39b, the cross angles of the laser beam pairs LB3, LB4 can be determined with high accuracy. In addition, the arrangement can remove the influence due to mutual various diffracted light for the laser beam pairs LB3, LB4 and the influence due to mutual interference for the beat diffracted light LB5, LB6, so that more accurate position detection can be done in the respective scan directions 38a, 38b, 39a, 39b of the diffraction grating marks 17, 18.

Fifth Embodiment

Figure 20:
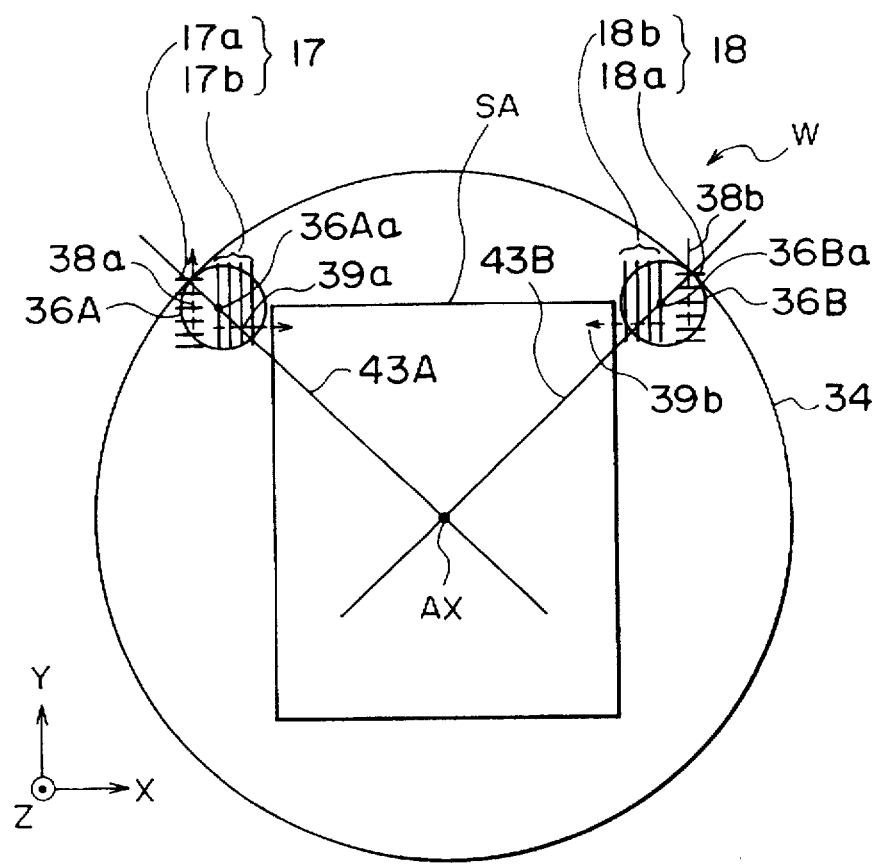
FIG. 20 is a plan view to show an arrangement in the XY plane, of the shot area and wafer marks formed on the wafer in the projection exposure apparatus of the fifth embodiment according to the present invention.

The present embodiment is a projection exposure apparatus as constructed substantially in the same arrangement as the projection exposure apparatus of the fourth embodiment as described above. However, as shown in FIG. 20, the reference straight line 37a passing the intersecting point between the surface of wafer W and the optical axis AX of projection optical system PL and the center 36Aa of the scan area 36A is set as inclined at an angle 45° relative to the moving direction of wafer W. On the other hand, the reference straight line 37b passing the intersecting point between the surface of wafer W and the optical axis AX of projection optical system PL and the center 36Ba of the scan area 36B is set in axis symmetry with the reference straight line 37a with respect to the center line of shot area SA parallel to the moving direction of wafer W. Thus, the scan areas 36A, 36B are deviated along the moving direction with respect to the intersecting point between the surface of wafer W and the optical axis AX of projection optical system PL.

On the wafer W the diffraction grating mark 17 is composed of a diffraction grating 17a the scan direction (pitch direction) 38a of which is set in the Y-axis direction and a diffraction grating 17b the scan direction 39a of which is set in the X-axis direction. On the other hand, the diffraction grating mark 18 is composed of a diffraction grating 18a the scan direction (pitch direction) 38b of which is set in the Y-axis direction and a diffraction grating 18b the scan direction 39b of which is set in the X-axis direction.

Here, a first scan straight line passing the center 36Aa of the scan area 36A and being parallel to the scan direction 38a and a second scan straight line passing the center 36Aa of the scan area 36A and being parallel to the scan direction 39a are arranged in axis symmetry with respect to the reference straight line 37a. Also, a third scan straight line passing the center 36Ba of the scan area 36B and being parallel to the scan direction 38b and a fourth scan straight line passing the center 36Ba of the scan area 36B and being parallel to the scan direction 39b are arranged in axis symmetry with respect to the reference straight line 37b.

The telecentricity breaking is effected on the alignment optical systems while maintaining the symmetry in the m direction as to the passing positions of the laser beam pairs LB3, LB4 on the pupil plane EP of projection optical system PL. Namely, on the pupil plane EP of projection optical system PL the passing positions of the laser beam pairs LB3, LB4 irradiating the diffraction grating mark 18 are set at axisymmetric positions with respect to a first auxiliary reference straight line. The first auxiliary reference straight line is a straight line passing the intersecting point between the pupil plane EP of projection optical system PL and the optical axis AX and being parallel to the reference straight line 37a. On the other hand, the passing positions of the laser beam pairs LB3, LB4 irradiating the diffraction grating mark 17 are also set at axisymmetric positions with respect to a second auxiliary reference straight line. The second auxiliary reference straight line is a straight line passing the intersecting point between the pupil plane EP of projection optical system PL and the optical axis AX and being parallel to the reference straight line 37b.

As a result, when the positions of the diffraction grating marks 17, 18 are detected through the projection optical system PL, the detection accuracy of wafer W in the scan directions 38a, 38b of the laser beam pair LB3 becomes equal to the detection accuracy of wafer W in the scan directions 39a, 39b of the laser beam pair LB4. Since the laser beams LB3, LB4 and the beat interference light beams LB5, LB6 are spatially separated on the pupil plane EP of projection optical system PL, the zeroth order light and ± second order diffracted light appearing as superimposed on at least one of the laser beams LB11, LB21 can be separated and removed as unnecessary light and the beat interference light LB5, LB6 can be perfectly separated and detected. Accordingly, more accurate position detection can be done in each scan direction 38a, 38b, 39a, 39b of the diffraction grating mark 17, 18.

Sixth Embodiment

Figure 21:
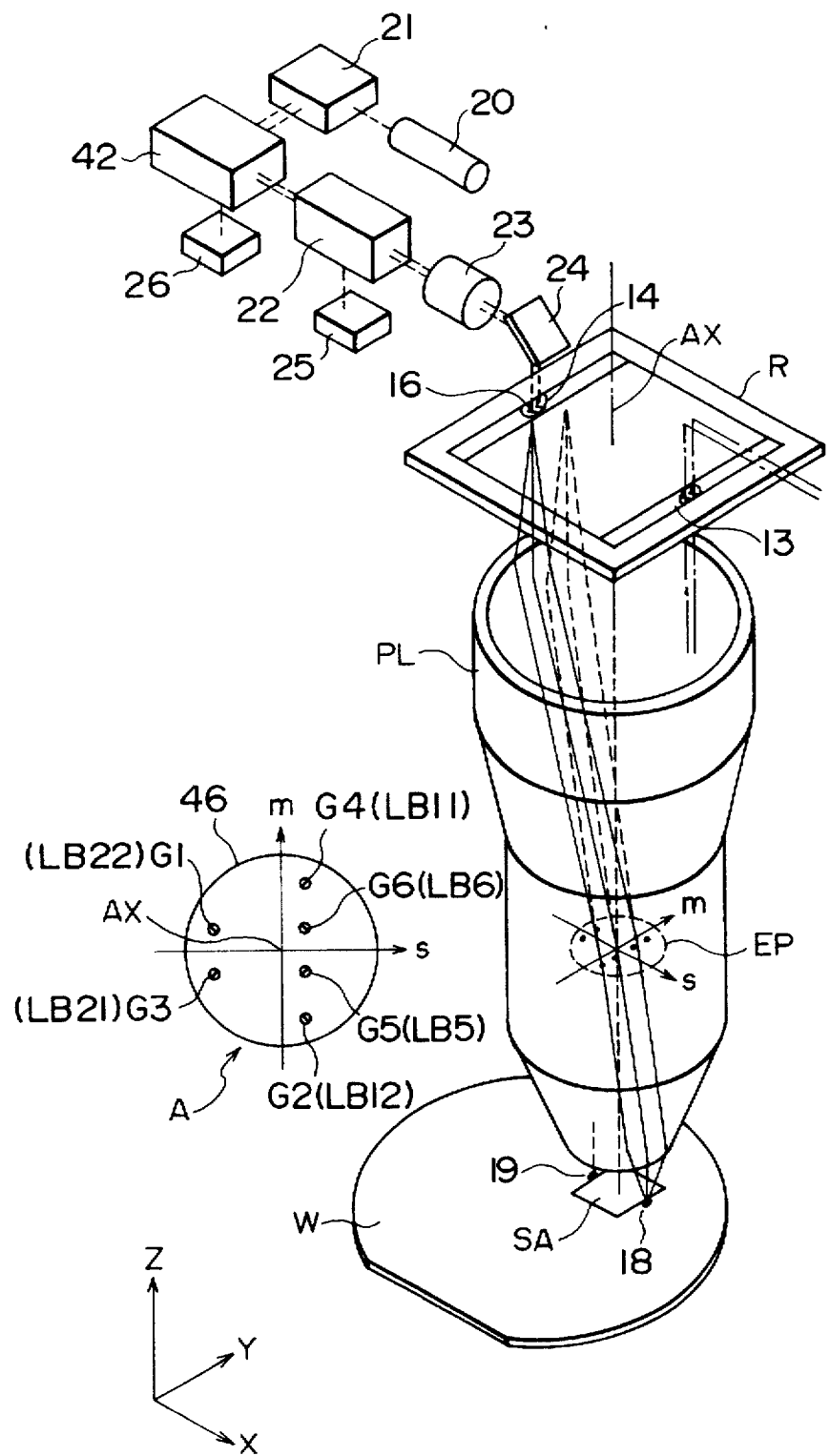
FIG. 21 is a perspective view to show the structure of the projection exposure apparatus of the sixth embodiment according to the present invention.

The present embodiment is a projection exposure apparatus as constructed substantially in the same structure as the projection exposure apparatus of the fourth embodiment as described previously. However, as shown in FIG. 21, an optical path controlling member for controlling chromatic aberration is provided near the pupil plane EP of projection optical system PL, for the laser beam pairs LB3, LB4 and the beat interference light beams LB5, LB6 emergent from the wafer W.

The projection optical system PL is well corrected for aberrations in the region near the wavelength of exposure light, but it normally has very large aberrations for light in the wavelength region 100 or more nm apart from the exposure wavelength. The alignment light needs to be light with wavelengths longer than the exposure wavelength, for example such as light in the ultraviolet region or near ultraviolet region, i.e., light with wavelengths to which a photosensitive material on substrate is not sensitive.

For example, where the exposure light is KrF excimer laser light (wavelength 248 nm) and if He-Ne laser light (wavelength 633 nm) is selected as the alignment light, the projection optical system PL without control will generate axial chromatic aberration of some 100 mm on the reticle. In order to eliminate such axial chromatic aberration, a conceivable measure is, for example as disclosed in Japanese Laid-open Patent Application No. 5-160001, that an optical path controlling member, for example such as a phase type diffraction grating, for controlling the optical path of alignment light is provided near the pupil plane EP of projection optical system PL, thereby correcting the aberration for the alignment light independently of the exposure light. Thus, a chromatic aberration controlling plate 46 made from an optically transparent substrate (glass substrate etc.) as indicated by the arrow A is set on the pupil plane EP of projection optical system PL. Detected objects by the alignment optical systems are the diffraction grating mark 18 on the wafer W and the diffraction grating mark 16 on the pattern surface of reticle R, and the telecentricity breaking is effected on the laser beam pairs LB3, LB4 projected from the alignment optical system to the diffraction grating mark 18. Therefore, on the pupil plane EP of projection optical system PL, as shown by the arrow A, passing positions of a pair of laser beams LB11, LB21 toward the diffraction grating mark 18 and passing positions of a pair of laser beams LB12, LB22 toward the diffraction grating mark 18 are set in axis symmetry with respect to the second auxiliary reference straight line.

Formed at the respective passing positions of the laser beams LB11, LB21, LB12, LB22 on the chromatic aberration controlling plate 46 are phase type diffraction gratings G4, G3, G2, G1 having a function to simultaneously correct axial chromatic aberration and lateral chromatic aberration for the laser beams. Accordingly, the pair of diffraction gratings G4, G3 and the pair of diffraction gratings G2, G1 are arranged in axis symmetry with respect to a first auxiliary reference straight line, which is a straight line passing an intersecting point between the surface of chromatic aberration controlling plate 46 and the optical axis AX of projection optical system PL and being parallel to the reference straight line 37b.

Because of this, the two laser beam pairs LB3, LB4 traveling toward the diffraction grating mark 18 are deflected by predetermined correction angles through diffraction at the associated diffraction gratings G1 to G4, and cross on the wafer W while maintaining predetermined cross angles. By this arrangement, the reticle R and the wafer W are kept in a conjugate relation on an apparent basis in the projection optical system PL, for the laser beams LB11 to LB22 of the different wavelength from that of the exposure light.

The beat interference light beams LB5, LB6 emerging through diffraction at the diffraction grating marks 17, 18 pass at axisymmetric positions with respect to the first auxiliary reference line, similarly as the incident beams, on the pupil plane EP of projection optical system PL. Diffraction gratings G5 and G6 are formed at the passing positions of the beat interference light beams LB5, LB6 on the chromatic aberration controlling plate 46. The beat interference light beams LB5, LB6 are deflected so as to be corrected for lateral chromatic aberration by the diffraction gratings G5 and G6, and then travel toward the reticle window 16. While the beat interference light beams LB5, LB6 are broken in telecentricity by a predetermined angle in the non-scan directions perpendicular to the scan directions 38b, 39b of the diffraction grating mark 18, they pass the cross point of the incident beams in the reticle window 16 and through the alignment objective 23, and are finally photoelectrically detected by the photoelectric detecting unit 25.

In this case, six diffraction gratings G7 to G12 are similarly arranged on the chromatic aberration controlling plate 46, for the laser beam pairs LB3, LB4 and the beat interference light beams LB5, LB6 as to the diffraction grating mark 17. As described, the optical paths of the laser beam pairs LB3, LB4 and the beat interference light beams LB5, LB6 are corrected by the deflection function of the diffraction gratings G1 to G12 as the optical path controlling member, but the telecentricity is maintained on either side of the projection optical system PL (even if the telecentricity breaking is effected) and the cross angles of the laser beam pairs LB3, LB4 are also maintained. Accordingly, even when the chromatic aberration controlling plate 46 on which the diffraction gratings G1 to G12 are formed is placed on the pupil plane EP of projection optical system PL, the positional relations of the laser beam pairs LB3, LB4 and the beat interference light beams LB5, LB6 on the pupil plane EP of projection optical system PL maintain axis symmetry with respect to the first auxiliary reference line, thus causing no difference in detection errors in the scan directions of diffraction grating marks 17, 18.

If the optical path controlling member is used for position detection of a plurality of diffraction grating marks through the projection optical system PL, the respective diffraction gratings need to be set with adjusting amounts of telecentricity breaking of the laser beams for each diffraction grating mark so as to avoid overlap between the plurality of diffraction gratings as the optical path controlling member, for example. Also in this case, the directions of telecentricity breaking of the laser beams for each diffraction grating mark can be set in the same manner as in the fourth embodiment as described above.

If a light beam having transmitted by a diffraction grating mark 15, 16 on the reticle R is reflected by the wafer W and again is transmitted by the diffraction grating mark 15, 16 to enter the objective lens 23 in the alignment optical system, as shown in FIG. 21, this incident light could become noise components to deteriorate the SN ratio of detection signals. However, when the chromatic aberration controlling plate 46 is used, signal light (beat interference light) and noise light can be surely separated from each other by providing no diffraction grating for correcting the optical paths of the light beams to become noise components or by providing diffraction gratings for intentionally increasing the chromatic aberration, whereby the noise light can be removed. On this occasion, it is desired that telecentricity of alignment light incident on the diffraction grating marks 15, 16 on the reticle R be broken in the opposite direction to the direction of telecentricity breaking of the alignment light incident on the diffraction grating marks 17, 18 on the wafer W, whereby light beams of the former are perfectly spatially separated from those of the latter on the pupil plane EP of projection optical system PL. This arrangement can prevent the diffraction gratings corresponding to alignment light irradiating the diffraction grating marks 17, 18 on the wafer W side, on the chromatic aberration controlling plate 46 from affecting light beams having transmitted by the diffraction grating marks 15, 16 on the reticle R side.

Seventh Embodiment

The present embodiment is a projection exposure apparatus constructed substantially in the same structure as the projection exposure apparatus of the fourth embodiment as described previously. However, this projection exposure apparatus has a function of the scanning exposure method being the step-and-scan method, similarly as the projection exposure apparatus of the first embodiment as described previously. Namely, the reticle R is moved, for example, at a predetermined speed $V_R$ in the +Y direction relative to the projection optical system PL upon exposure, and in synchronization therewith, the wafer W is moved at $\beta \cdot V_R$ (where $\beta$ is a projection magnification of the projection optical system PL) in the −Y direction relative to the projection optical system PL.

Figure 22:
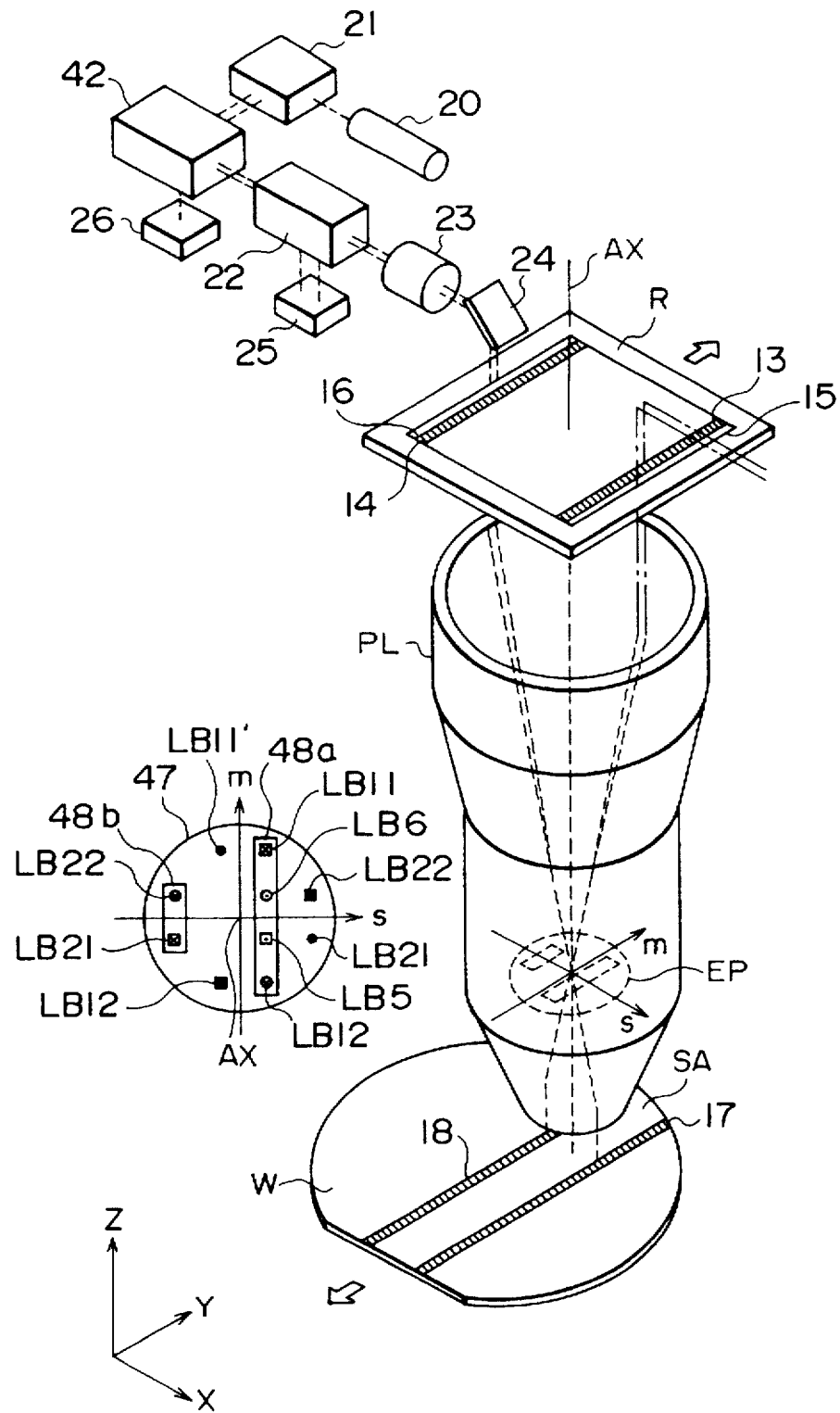
FIG. 22 is a perspective view to show the structure of the projection exposure apparatus of the seventh embodiment according to the present invention.

As shown in FIG. 22, diffraction grating marks 13, 14 aligned along the Y-axis direction are formed on either side in the X-axis direction, of the pattern area PA of reticle R. Reticle windows 15, 16 elongated along the Y-axis direction are formed outside these diffraction grating marks 13, 14. Similarly, diffraction grating marks 17, 18 aligned along the Y-axis direction are formed on either side in the X-axis direction, of shot area SA on the wafer W.

Here, this projection exposure apparatus is constructed to inspect a synchronizing state between the wafer W and the reticle R upon scanning exposure. Thus, the projection optical system PL does not actually perform exposure and transfer. Namely, this projection exposure apparatus is not provided with an illumination optical system for exposure. Accordingly, the projection optical system PL does not have to be precisely corrected for aberrations for the exposure wavelength, and as to the wavelength of alignment light, it needs only a relay lens of a simple structure corrected for aberrations only for image heights where the diffraction grating marks 17, 18 as alignment marks are located. Since image formation by exposure light is unnecessary, a spatial filter plate 47 for alignment light can be set near the pupil plane EP of projection optical system PL.

This spatial filter plate 47 is composed of an opening portion 48a for transmitting two laser beam pairs LB3 (LB11, LB21), LB4 (LB12, LB22) traveling toward the diffraction grating mark 17 on the wafer W, an opening portion 48b for transmitting only two beat interference light beams LB5, LB6 from the diffraction grating mark 17, and a light-shielding portion occupying the other region. By this arrangement, the light-shielding portion in the spatial filter plate 47 shields unnecessary light of two laser beam pairs LB3' (LB11', LB21'), LB4' (LB12', LB22') emitted for position detection of the diffraction grating mark 14 on the reticle R but transmitted by the diffraction grating mark 14. This arrangement can prevent the light transmitted by the diffraction grating mark 14 of reticle R from reaching the wafer W, which in turn prevents reflected light thereof from the wafer W from returning to the diffraction grating mark 14 of reticle R, thus remaining no possibility that the light mixes in signal light to cause noise. Namely, the noise components are perfectly separated and removed.

In this case, further two opening portions are similarly formed on the spatial filter plate 47, for the two laser beam pairs LB3', LB4' to the diffraction grating mark 13 on the reticle R. In order to completely transmit only the laser beam pairs LB3, LB4 illuminating the diffraction grating marks 17, 18 on the wafer W, and beat interference light beams therefrom LB5, LB6 and to shield light transmitted by the diffraction grating marks 13, 14 on the reticle R, using the spatial filter plate 47, a possible arrangement is such that telecentricity breaking is effected on the laser beam pair on the wafer W side and the laser beam pair on the reticle R side and directions of the telecentricity breaking are made opposite to each other, thereby spatially separating the two beam pairs on the pupil plane EP of projection optical system PL. In this case, if the degree or telecentricity breaking is made equal between the laser beam pair on the wafer W side and the laser beam pair on the reticle R side, the spatial filter plate 47 may be constructed in a simple structure having four slit openings.

The present invention is by no means limited to the above-described embodiments, but may have a variety of arrangements and modifications within a scope not departing from the essence of the present invention. For example, the above-described embodiments employed the two-dimensional diffraction grating marks of the V shape (inverse V shape) or one-dimensional diffraction grating marks juxtaposed as alignment marks, but the following diffraction grating marks may be employed.

Figure 23:
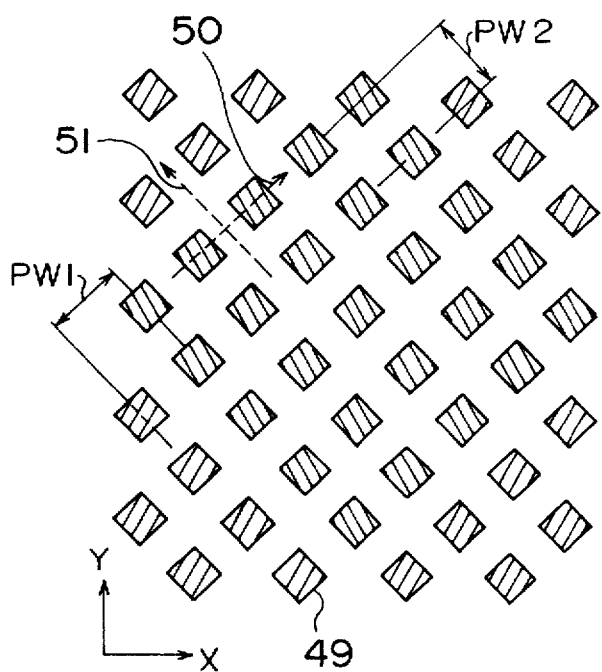
FIG. 23 to FIG. 28 are plan views to show the partial structures in the XY plane, of modifications of the wafer marks formed on the wafer in the projection exposure apparatus of various embodiments according to the present invention.

As shown in FIG. 23, an alignment mark on the wafer W side, i.e., a wafer mark includes patterns 49 of square projections (or recesses) arranged at pitches PW1 and PW2 (=PW1) in respective scan directions 50, 51 perpendicular to each other. The scan directions 50, 51 intersect at angles 45° with the Y axis. The width of each pattern 49 is approximately a half of the pitch PW1.

Figure 24:
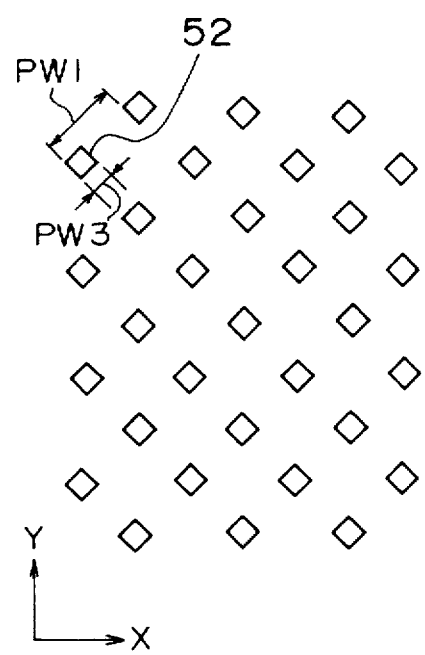

If the width of projections of the wafer mark is equal to the width of recesses, the wafer mark could be broken at step portions. In order to prevent such breaking, it is effective to use a wafer mark in which patterns 52 of square projections (or recesses) the width PW3 of which is narrower than a half of the pitch PW1 are two-dimensionally arranged, as shown in FIG. 24.

Figure 25:
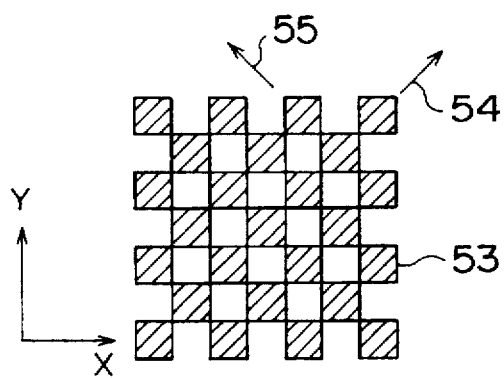

In another case, a wafer mark includes patterns 53 of square projections (or recesses) arranged in a checkered pattern, as shown in FIG. 25. Two scan directions 54, 55 in this case intersect at angles 45° with the Y axis, and pitches (execution pitches) are equal to each other in the scan directions 54, 55.

Figure 26:
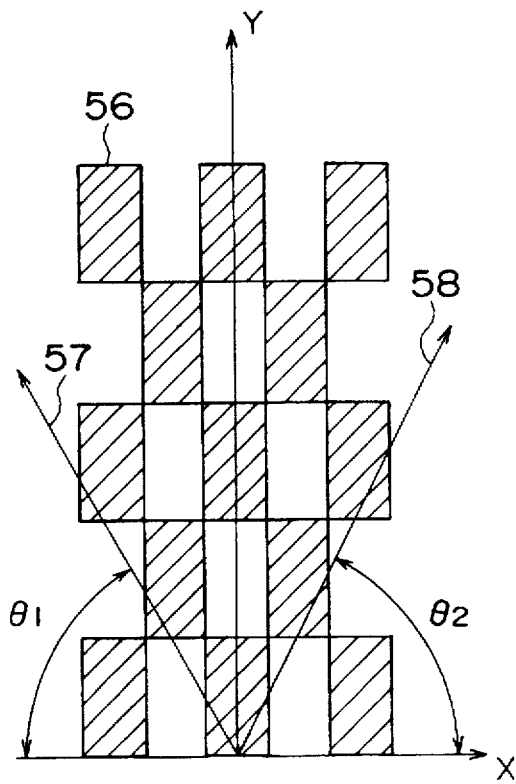

In another case, as shown in FIG. 26, a wafer mark is constructed to include rectangular patterns 56 arranged in a checkered pattern. The sides of patterns 56 are parallel to the X axis or Y axis, and the length of the X-directional sides is shorter than the length of the Y-directional sides. Since the reference straight line passing the center of scan area of wafer W and the intersecting point between the surface of wafer W and the optical axis AX of projection optical system PL is parallel to the X axis, the two scan directions 57, 58 of the wafer mark extend along directions parallel to the diagonal lines of the patterns 56. An angle $\theta_1$ between the scan direction 57 and the X axis is equal to an angle $\theta_2$ between the scan direction 58 and the X axis. The angles $\theta_1$, $\theta_2$ between the scan directions 57, 58 and the reference line are determined based on the aspect ratio of the patterns 56. Here, a change of the angles $\theta_1$, $\theta_2$ or a change of the size of the patterns 56 will change the pitches (execution pitches) along the scan directions 57, 58.

Figure 27:
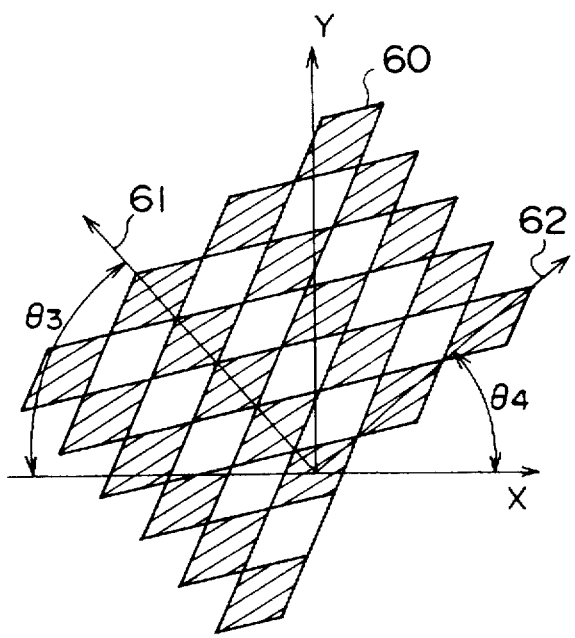

In another case, as shown in FIG. 27, a wafer mark is constructed of rhombic patterns 60 arranged in a checkered pattern. One scan direction 61 of the wafer mark is parallel to one diagonal line of the patterns 60, and the other scan direction 62 is parallel to the other diagonal line of the patterns 60. The scan directions 62, 63 are perpendicular to each other. Since the reference straight line is not always parallel to the X axis, a clockwise angle $\theta_3$ between the scan direction 61 and the X axis is not always coincident with a counterclockwise angle $\theta_4$ between the scan direction 62 and the X axis. Here, the pitches along the scan directions 61, 62 are different from each other.

Figure 28:
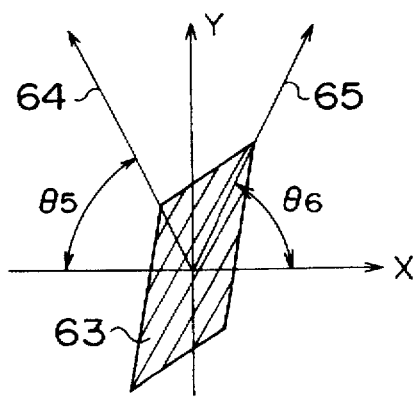

Further, generalizing such wafer marks, a wafer mark is constructed of parallelogram patterns 63, as shown in FIG. 28, arranged in a checkered pattern. One scan direction 64 is parallel to one diagonal line of the patterns 63, and the other scan direction 65 is parallel to the other diagonal Line of the patterns 63. Accordingly, the two scan directions 64, 65 can be set in desired directions by the arrangement direction and the shape of the patterns 63. Namely, an angle $\theta_5$ between the scan direction 64 and the X axis and an angle $\theta_6$ between the scan direction 65 and the X axis can be set to desired values. Further, the pitches along the scan directions 64, 65 can be set to mutually different values.

However, the symmetry with respect to the reference line, of the two scan directions of the wafer mark can be broken to some extent by the magnitude of aberrations with the alignment light in the projection optical system. Namely, if aberration does not change so much near a certain scan direction, the scan direction may be changed within the range.

The above-described embodiments employed the LIA type for the alignment mechanism, but the LSA (Laser Step Alignment) type or the FIA (Field Image Alignment) type of the image pickup method as described below may be employed for the alignment mechanism.

(1) Alignment mechanism of the LSA type: a system for irradiating a wafer mark with a laser beam and measuring the position of the wafer mark utilizing diffracted and scattered light, which has been widely used for various process wafers.

(2) Alignment mechanism of the FIA type: a sensor for performing position measurement by image-processing an image of wafer mark illuminated with light in a wide wavelength band from a light source such as a halogen lamp, which is effective for measurement of asymmetric marks on an aluminum layer or a wafer surface.

Figure 29:
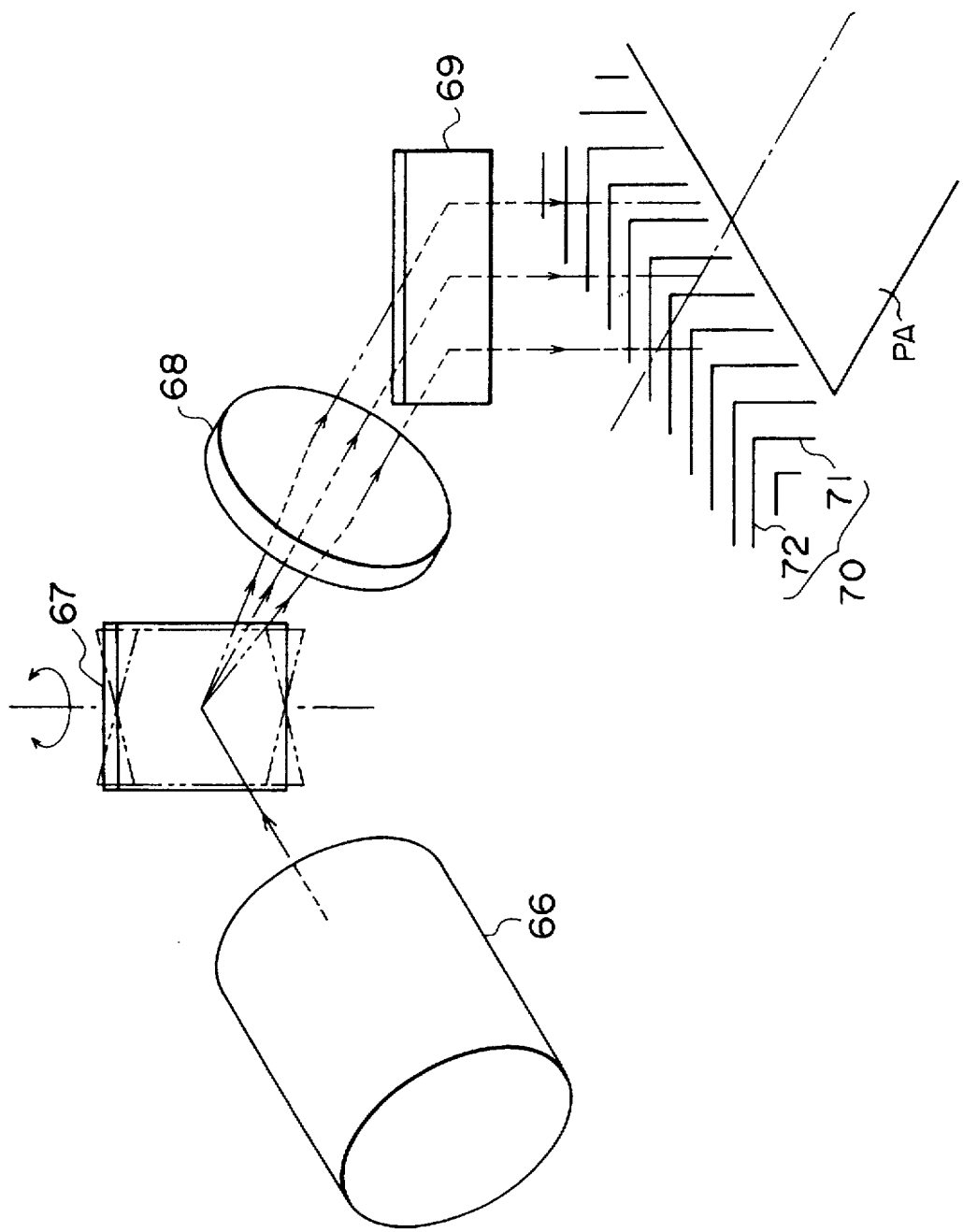
FIG. 29 is a perspective view to show the partial structure of a modefication of the alignment mechanism in the projection exposure apparatus in the embodiments according to the present invention.

Another arrangement may employ such an alignment optical system, as shown in FIG. 29, as to scan a laser beam along a scan direction of diffraction grating mark on the wafer W or reticle R and to detect reflected light of the laser beam. A laser beam emitted from a light-sending system 66 is deflected by a rotary mirror 67 to enter an objective lens 68, and thereafter is reflected by a vertical illumination mirror 69 to illuminate a diffraction grating mark 70 on the reticle R. This diffraction grating mark 70 is composed of two diffraction gratings 71, 72 formed near the pattern area PA. Here, the laser beam scans the diffraction grating mark 70 along one pitch direction of the diffraction grating 71, 72, based on rotation of a reflective surface of the rotary mirror 67. The apparatus is also provided with another alignment optical system for scanning the diffraction grating mark 70 along the other pitch direction of the diffraction grating 71, 72. Further, the apparatus is also provided with alignment optical systems for scanning a diffraction grating mark on the wafer W in two pitch directions thereof.

Further, the above-described embodiments used the alignment mechanism of the TTR method, but an alignment system of the TTL method or the off-axis method may be employed as the alignment mechanism.

As detailed above, the alignment mechanism in the projection exposure apparatus of the present invention is so arranged that the first and second scan straight lines are set in axis symmetry with respect to the reference straight line passing the intersecting point between the mutually different first and second scan lines included in the surface of wafer and the intersecting point between the surface of wafer and the optical axis of projection optical system and that two sets of laser beams are scanned along the first and second scan lines. Here, the reference straight line is coincident with the meridional direction or the sagittal direction of the projection optical system. Thus, meridional and sagittal components equally contribute to aberrations or projection magnifications of laser beams scanning along the first and second scan lines. Accordingly, the aberrations or projection magnifications of laser beams scanning along the first and second scan lines are coincident with each other, and position detection of wafer along the first and second scan lines can be accurately made with same accuracy.

When this alignment mechanism sets the passing positions of first and second light beams on the pupil plane of projection optical system in axis symmetry with respect to the auxiliary reference line passing the intersecting point between the pupil plane of projection optical system and the optical axis of projection optical system and being parallel to the reference line, the incident directions of laser beams relative to the first and second scan lines are inclined in respective directions perpendicular to the first and second scan lines. Thus, passing positions of respective reflected light of the first and second light beams on the pupil plane of projection optical system are arranged in axis symmetry with each other with respect to the auxiliary reference line. Accordingly, the first and second light beams are free of influence due to these reflected light, and the reflected light of the first and second light beams is free of influence due to interference with each other, whereby position detection of wafer can be more accurately performed with high accuracy along the first and second scan lines.

With the optical path controlling member for correcting chromatic aberration caused by the projection optical system for light beams for position detection, being provided in the vicinity of the pupil plane of projection optical system, the mask and photosensitive substrate can be kept nearly conjugate with each other for the light beams for position detection even if the wavelength of the position detection beams is largely different from the wavelength of the exposure light, whereby an amount of positional deviation can be accurately detected between the mask and the substrate by the TTR method.

If a spatial filter member for shielding the light beams for position detection transmitted by the positioning marks on the mask is provided near the pupil plane of projection optical system, for example upon adjusting the stage mechanism or positioning mechanism, etc., the adjustment etc. can be accurately and quickly completed because unnecessary light beams can be shielded.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application No. 127481/1994 filed on Jun. 9 1994 is hereby incorporated by reference.

What is claimed is:

1. A projection exposure apparatus comprising:

an illumination optical system for irradiating exposure light of a predetermined wavelength to a photomask pattern formed on a reticle;

a projection optical system for projecting said exposure light having passed through the whole of said photomask pattern at a predetermined magnification to a photosensitive film formed on a surface of a wafer;

a reticle stage for holding said reticle and moving a surface of said reticle within a first reference plane substantially perpendicular to an optical axis of said projection optical system;

a wafer stage for holding said wafer and moving the surface of said wafer within a second reference plane substantially perpendicular to the optical axis of said projection optical system and different from said first reference plane;

a driving mechanism comprising reticle driving means for driving said reticle stage and wafer driving means for driving said wafer stage;

an alignment mechanism for measuring an amount of relative positional deviation between said reticle and said wafer; and a controlling mechanism comprising reticle controlling means for controlling said reticle driving means, wafer controlling means for controlling said wafer driving means, and servo controlling means for controlling at least one of said reticle controlling means and said wafer controlling means, based on the amount of relative positional deviation between said reticle and said wafer, measured by said alignment mechanism;

wherein said wafer comprises a wafer mark formed as diffraction gratings having two types of pitches in at least one region adjacent to a shot area to which an image of said photomask pattern is transferred, and said reticle comprises a reticle mark formed as diffraction gratings having two types of pitches in at least one region adjacent to a pattern area in which said photomask pattern is located, and wherein said alignment mechanism comprises:

a first light-sending system for setting a first scan straight line and a second scan straight line being respectively parallel to two directions along which the diffraction gratings having two types of pitches are arranged in said wafer mark, in axis symmetry with respect to a reference straight line passing an intersecting point between said first and second scan straight lines and an intersecting point between the surface of said wafer and the optical axis of said projection optical system, for sending a first light beam and a second light beam different from said first light beam through said projection optical system to said wafer, and for scanning said first and second light beams along said first and second scan straight lines, respectively;

a second light-sending system for sending a third light beam different from said first and second light beams, and a fourth light beam different from said first to third light beams to said reticle, and for scanning said third and fourth light beams along a third scan straight line and a fourth scan straight line being respectively parallel to two directions along which the diffraction gratings having two types of pitches are arranged in said reticle mark, respectively;

a first light-receiving system for detecting reflected light of said first light beam emergent from said wafer mark and detecting reflected light of said third light beam emergent from said reticle mark; and a second light-receiving system for detecting reflected light of said second light beam emergent from said wafer mark and detecting reflected light of said fourth light beam emergent from said reticle mark.

2. A projection exposure apparatus according to claim 1, wherein said first light-sending system sets loci of said first and second light beams on a pupil plane of said projection optical system in axis symmetry with respect to an auxiliary reference straight line being parallel to said reference straight line and passing an intersecting point between the pupil plane of said projection optical system and the optical axis of said projection optical system.

3. A projection exposure apparatus according to claim 1, wherein said first light-sending system deviates an intersecting point between the loci of said first and second light beams along said auxiliary reference straight line with respect to the intersecting point between the surface of said wafer and the optical axis of said projection optical system.

4. A projection exposure apparatus according to claim 1, wherein said second light-sending system sets said third scan straight line as conjugate with said first scan straight line through said projection optical system and also sets said fourth scans straight line as conjugate with said second scan straight line through said projection optical system.

5. A projection exposure apparatus according to claim 1, wherein said servo controlling means controls said reticle controlling means and said wafer controlling means in harmony with each other, thereby canceling the amount of relative positional deviation between said reticle and said wafer, measured by said alignment mechanism.

6. A projection exposure apparatus according to claim 1, wherein said servo controlling means controls only either one of said reticle controlling means and said wafer controlling means, thereby canceling the amount of relative positional deviation between said reticle and said wafer, measured by said alignment mechanism.

7. A projection exposure apparatus according to claim 1, wherein said projection optical system comprises an optical path controlling member disposed on a pupil plane of said projection optical system or on a plane located in the vicinity of said pupil plane, for correcting chromatic aberrations appearing in said first and second light beams and in reflected light of said first and second light beams, emergent from the surface of said wafer.

8. A projection exposure apparatus according to claim 1, wherein said projection optical system comprises a spatial filter member disposed on a pupil plane of said projection optical system or on a plane located in the vicinity of said pupil plane, for shielding said third and fourth light beams transmitted by said reticle.

9. A projection exposure apparatus according to claim 1, wherein said first light-sending system includes two first rotary mirrors for deflecting said first and second light beams on the basis of rotation of two reflective surfaces of said first two rotary mirrors, so as to scan said first and second light beams along said first and second scan straight lines, respectively, and wherein said second light-sending system includes two second rotary mirrors for deflecting said third and fourth light beams on the basis of rotation of two reflective surfaces of said second two rotary mirrors, so as to scan said third and fourth light beams along said third and fourth scan straight lines, respectively.

10. A projection exposure apparatus according to claim 1, wherein said first light-sending system outputs a first beam pair composed of two light beams having a first frequency difference as said first light beam, and makes the two light beams constituting said first light beam pair intersect with each other in symmetry on said first scan straight line, thereby generating first interference fringes running along said first scan straight line, wherein said first light-sending system outputs a second beam pair composed of two light beams having a second frequency difference as said second light beam, and makes the two light beams constituting said second light beam pair intersect with each other in symmetry on said second scan straight line, thereby generating second interference fringes running along said second scan straight line, wherein said second light-sending system outputs a third beam pair composed of two light beams having a third frequency difference as said third light beam, and makes the two light beams constituting said third light beam pair intersect with each other in symmetry on said third scan straight line, thereby generating third interference fringes running along said third scan straight line, and wherein said second light-sending system outputs a fourth beam pair composed of two light beams having a fourth frequency difference as said fourth light beam, and makes the two light beam constituting said fourth light beam pair intersect with each other in symmetry on said fourth scan straight line, thereby generating fourth interference fringes running along said fourth scan straight line.

11. A projection exposure apparatus according to claim 10, wherein said first light-sending system sets two first intersecting points between the two light beams constituting said first light beam pair and a pupil plane of said projection optical system and two second intersecting points between the two light beams constituting said second light beam pair and the pupil plane of said projection optical system in axis symmetry with respect to an auxiliary reference straight line being parallel to said reference straight line and passing an intersecting point between the pupil plane of said projection optical system and the optical axis of said projection optical system.

12. A projection exposure apparatus according to claim 11, wherein said first light-sending system deviates a distribution of said two first intersecting points and said two second intersecting points along said auxiliary reference straight line with respect to the intersecting point between the surface of said wafer and the optical axis of said projection optical system.

13. A projection exposure apparatus according to claim 10, wherein said second light sending system sets said third scan straight line as conjugate with said first scan straight line through said projection optical system, and sets said fourth scan straight line as conjugate with said second scan straight line through said projection optical system.

14. A projection exposure apparatus according to claim 10, wherein said projection optical system comprises an optical path controlling member disposed on a pupil plane of said projection optical system or on a plane located in the vicinity of said pupil plane, for correcting chromatic aberrations appearing in said first and second light beam pairs and in reflected light of said first and second light beam pairs, emergent from the surface of said wafer.

15. A projection exposure apparatus according to claim 10, wherein said projection optical system comprises a spatial filter member disposed on a pupil plane of said projection optical system or on a plane located in the vicinity of said pupil plane, for shielding said third and fourth light beam pairs transmitted by said reticle.

16. A projection exposure apparatus according to claim 10, wherein said first light-receiving system measures a phase difference between diffracted light of said first light beam pair emergent from said wafer mark and diffracted light of said third light beam pair emergent from said reticle mark, and wherein said second light-receiving system measures a phase difference between diffracted light of said second light beam pair emergent from said wafer mark and diffracted light of said fourth light beam pair emergent from said reticle mark.

17. A projection exposure apparatus comprising:

an illumination optical system for irradiating exposure light of a predetermined wavelength to a photomask pattern formed on a reticle;

a projection optical system for projecting said exposure light having passed through a part of said photomask pattern at a predetermined magnification to a photosensitive film formed on a surface of a wafer;

a reticle stage for holding said reticle and moving a surface of said reticle within a first reference plane substantially perpendicular to an optical axis of said projection optical system;

a wafer stage for holding said wafer and moving the surface of said wafer within a second reference plane substantially perpendicular to the optical axis of said projection optical system and different from said first reference plane;

a driving mechanism comprising reticle driving means for driving said reticle stage and wafer driving means for driving said wafer stage;

an alignment mechanism for measuring an amount of relative positional deviation between said reticle and said wafer; and a controlling mechanism comprising reticle controlling means for controlling said reticle driving means, thereby moving the surface of said reticle along a moving direction included in said first reference plane, wafer controlling means for controlling said wafer driving means, thereby moving the surface of said wafer along a conjugate moving direction conjugate with said moving direction through said projection optical system and included in said second reference plane, and servo controlling means for controlling at least one of said reticle controlling means and said wafer controlling means, based on the amount of relative positional deviation between said reticle and said wafer, measured by said alignment mechanism;

wherein said wafer comprises a wafer mark formed as diffraction gratings having two types of pitches, in a region adjacent to a shot area to which an image of said photomask pattern is transferred and extending along said conjugate moving direction, and said reticle comprises a reticle mark formed as diffraction gratings having two types of pitches, in a region adjacent to a pattern area in which said photomask pattern is located and extending along said moving direction, and wherein said alignment mechanism comprises:

a first light-sending system for setting a first scan straight line and a second scan straight line being respectively parallel to two directions along which the diffraction gratings having two types of pitches are arranged in said wafer mark, in axis symmetry with respect to a reference straight line passing an intersecting point between said first and second scan straight lines and an intersecting point between the surface of said wafer and the optical axis of said projection optical system, for sending a first light beam and second light beam different from said first light beam through said projection optical system to said wafer, and for scanning said first and second light beams along said first and second scan straight lines, respectively;

a second light-sending system for sending a third light beam different from said first and second light beams, and a fourth light beam different from said first to third light beams to said reticle, and for scanning said third and fourth light beams along a third scan straight line and a fourth scan straight line being respectively parallel to two directions along which the diffraction gratings having two types of pitches are arranged in said reticle mark, respectively;

a first light-receiving system for detecting reflected light of said first light beam emergent from said wafer mark and detecting reflected light of said third light beam emergent from said reticle mark; and a second light-receiving system for detecting reflected light of said second light beam emergent from said wafer mark and detecting reflected light of said fourth light beam emergent from said reticle mark.

18. A projection exposure apparatus according to claim 17, wherein said first light-sending system sets loci of said first and second light beams on a pupil plane of said projection optical system in axis symmetry with respect to an auxiliary reference straight line being parallel to said reference straight line and passing an intersecting point between the pupil plane of said projection optical system and the optical axis of said projection optical system.

19. A projection exposure apparatus according to claim 18, wherein said first light-sending system deviates an intersecting point between the loci of said first and second light beams along said auxiliary reference straight line with respect to the intersecting point between the surface of said wafer and the optical axis of said projection optical system.

20. A projection exposure apparatus according to claim 17, wherein said second light-sending system sets said third scan straight line as conjugate with said first scan straight line through said projection optical system and also sets said fourth scan straight line as conjugate with said second scan straight line through said projection optical system.

21. A projection exposure apparatus according to claim 17, wherein said servo controlling means controls said reticle controlling means and said wafer controlling means in harmony with each other, thereby canceling the amount of relative positional deviation between said reticle and said wafer, measured by said alignment mechanism.

22. A projection exposure apparatus according to claim 17, wherein said servo controlling means controls either one of said reticle controlling means and said wafer controlling means at a constant speed, and controls the other one of said reticle controlling means and said wafer controlling means so as to follow said either one controlled at the constant speed, thereby canceling the amount of relative positional deviation between said reticle and said wafer, measured by said alignment mechanism.

23. A projection exposure apparatus according to claim 17, wherein said projection optical system comprises an optical path controlling member disposed on a pupil plane of said projection optical system or on a plane located in the vicinity of said pupil plane, for correcting chromatic aberrations appearing in said first and second light beams and in reflected light of said first and second light beams, emergent from the surface of said wafer.

24. A projection exposure apparatus according to claim 17, wherein said projection optical system comprises a spatial filter member disposed on a pupil plane of said projection optical system or on a plane located in the vicinity of said pupil plane, for shielding said third and fourth light beams transmitted by said reticle.

25. A projection exposure apparatus according to claim 17, wherein said first light-sending system includes two first rotary mirrors for deflecting said first and second light beams on the basis of rotation of two reflective surfaces of said first two rotary mirrors, so as to scan said first and second light beams along said first and second scan straight lines, respectively, and wherein said second light-sending system includes two second rotary mirrors for deflecting said third and fourth light beams on the basis of rotation of two reflective surfaces of said second two rotary mirrors, so as to scan said third and fourth light beams along said third and fourth scan straight lines, respectively.

26. A projection exposure apparatus according to claim 17, wherein said first light-sending system outputs a first beam pair composed of two light beams having a first frequency difference as said first light beam, and makes the two light beams constituting said first light beam pair intersect with each other in symmetry on said first scan straight line, thereby generating first interference fringes running along said first scan straight line, wherein said first light-sending system outputs a second beam pair composed of two light beams having a second frequency difference as said second light beam, and makes the two light beams constituting said second light beam pair intersect with each other in symmetry on said second scan straight line, thereby generating second interference fringes running along said second scan straight line, wherein said second light-sending system outputs a third beam pair composed of two light beams having a third frequency difference as said third light beam, and makes the two light beams constituting said third light beam pair intersect with each other in symmetry on said third scan straight line, thereby generating third interference fringes running along said third scan straight line, and wherein said second light-sending system outputs a fourth beam pair composed of two light beams having a fourth frequency difference as said fourth light beam, and makes the two light beams constituting said fourth light beam pair intersect with each other in symmetry on said fourth scan straight line, thereby generating fourth interference fringes running along said fourth scan straight line.

27. A projection exposure apparatus according to claim 26, wherein said first light-sending system sets two first intersecting points between the two light beams constituting said first light beam pair and a pupil plane of said projection optical system and two second intersecting points between the two light beams constituting said second light beam pair and the pupil plane of said projection optical system in axis symmetry with respect to an auxiliary reference straight line being parallel to said reference straight line and passing an intersecting point between the pupil plane of said projection optical system and the optical axis of said projection optical system.

28. A projection exposure apparatus according to claim 27, wherein said first light-sending system deviates a distribution of said two first intersecting points and said two second intersecting points along said auxiliary reference straight line with respect to the intersecting point between the surface of said wafer and the optical axis of said projection optical system.

29. A projection exposure apparatus according to claim 26, wherein said second light-sending system sets said third scan straight line as conjugate with said first scan straight line through said projection optical system, and sets said fourth scan straight line as conjugate with said second scan straight line through said projection optical system.

30. A projection exposure apparatus according to claim 26, wherein said projection optical system comprises an optical path controlling member disposed on a pupil plane of said projection optical system or on a plane located in the vicinity of said pupil plane, for correcting chromatic aberrations appearing in said first and second light beam pairs and in reflected light of said first and second light beam pairs, emergent from the surface of said wafer.

31. A projection exposure apparatus according to claim 26, wherein said projection optical system comprises a spatial filter member disposed on a pupil plane of said projection optical system or on a plane located in the vicinity of said pupil plane, for shielding said third and fourth light beam pairs transmitted by said reticle.

32. A projection exposure apparatus according to claim 26, wherein said first light-receiving system measures a phase difference between diffracted light of said first light beam pair emergent from said wafer mark and diffracted light of said third light beam pair emergent from said reticle mark, and wherein said second light-receiving system measures a phase difference between diffracted light of said second light beam pair emergent from said wafer mark and diffracted light of said fourth light beam pair emergent from said reticle mark.

33. A projection exposure method for irradiating exposure light of a predetermined wavelength to a photomask pattern formed on a reticle by an illumination optical system and for projecting said exposure light having passed through at least one part of said photomask pattern at a predetermined magnification to a photosensitive film formed on a surface of a wafer by a projection optical system, comprising:

a first phase for measuring, by an alignment mechanism, an amount of relative positional deviation between said reticle, which includes a reticle mark formed as diffraction gratings having two types of pitches in at least one region adjacent to a pattern area in which said photomask pattern is located, and said wafer, which includes a wafer mark formed as diffraction gratings having two types of pitches in at least one region adjacent to a shot area to which an image of said photomask pattern is transferred; and a second phase for controlling, by a controlling mechanism, at least one of a drive for a reticle stage for holding said reticle and moving a surface of said reticle within a first reference plane substantially perpendicular to an optical axis of said projection optical system and a drive for a wafer stage for holding said wafer and moving the surface of said wafer within a second reference plane substantially perpendicular to the optical axis of said projection optical system and different from said first reference plane, based on the amount of relative positional deviation between said reticle and said wafer measured by said alignment mechanism, thereby canceling the amount of relative positional deviation between said reticle and said wafer;

wherein said first phase comprises:

a first step for setting, by a first light-sending system, a first scan straight line and a second scan straight line being respectively parallel to two directions along which the diffraction gratings having two types of pitches are arranged in said wafer mark, in axis symmetry with respect to a reference straight line passing an intersecting point between said first and second scan straight lines and an intersecting point between the surface of said wafer and the optical axis of said projection optical system;

a second step for sending, by said first light-sending system, a first light beam and a second light beam different from said first light beam through said projection optical system to said wafer, and scanning, by said first light-sending system, said first and second light beams along said first and second scan straight lines, respectively, and for sending, by a second light-sending system, a third light beam different from said first and second light beams, and a fourth light beam different from said first to third light beams to said reticle, and scanning, by said second light-sending system, said third and fourth light beams along a third scan straight line and a fourth scan straight line being respectively parallel to two directions along which the diffraction gratings having two types of pitches are arranged in said reticle mark, respectively; and a third step for detecting, by a first light-receiving system, reflected light of said first light beam emergent from said wafer mark and detecting reflected light of said third light beam emergent from said reticle mark, and for detecting, by a second light-receiving system, reflected light of said second light beam emergent from said wafer mark and detecting reflected light of said fourth light beam emergent from said reticle mark.

34. A projection exposure method according to claim 33, wherein said first and second phases are performed, before the surfaces of said reticle and said wafer are fixed on said first and second reference planes, respectively, and said exposure light having passed through the whole of said photomask pattern is projected to said photosensitive film.

35. A projection exposure method according to claim 34, wherein said second phase includes a phase of controlling, by said controlling mechanism, only either one of the drives of said reticle stage and said wafer stage, thereby canceling the amount of relative positional deviation between said reticle and said wafer, measured by said alignment mechanism.

36. A projection exposure method according to claim 33, wherein said first and second phases are performed to said reticle mark, which is formed in the region being adjacent to said pattern area and extending along a moving direction included in said first reference plane, and said wafer mark, which is formed in the region being adjacent to said shot area and extending along a conjugate moving direction conjugate with said moving direction through said projection optical system and included in said second reference plane, while the surfaces of said reticle and said wafer are moved along said moving direction and along said conjugate moving direction, respectively, and said exposure light having passed through the part of said photomask pattern is projected to said photosensitive film.

37. A projection exposure method according to claim 36, wherein said second phase includes a phase of controlling, by said controlling mechanism, either one of the drives of said reticle stage and said wafer stage at a constant speed, and controls the other one of said reticle controlling means and said wafer controlling means so as to follow said either one controlled at the constant speed, thereby canceling the amount of relative positional deviation between said reticle and said wafer, measured by said alignment mechanism.

38. A projection exposure method according to claim 33, wherein said first step includes a step of setting, by said first light-sending system, loci of said first and second light beams on a pupil plane of said projection optical system in axis symmetry with respect to an auxiliary reference straight line being parallel to said reference straight line and passing an intersecting point between the pupil plane of said projection optical system and the optical axis of said projection optical system.

39. A projection exposure method according to claim 38, wherein said first step includes a step of deviating, by said first light-sending system, an intersecting point between the loci of said first and second light beams along said auxiliary reference straight line with respect to the intersecting point between the surface of said wafer and the optical axis of said projection optical system.

40. A projection exposure method according to claim 33, wherein said first step includes a step of setting, by said second light-sending system, said third scan straight line as conjugate with said first scan straight line through said projection optical system and a step of setting, by said second light-sending system, said fourth scan straight line as conjugate with said second scan straight line through said projection optical system.

41. A projection exposure method according to claim 33, wherein said second phase includes a phase of controlling, by said controlling mechanism, the drives of said reticle stage and said wafer stage in harmony with each other, thereby canceling the amount of relative positional deviation between said reticle and said wafer, measured by said alignment mechanism.

42. A projection exposure method according to claim 33, wherein said second step includes a step of correcting chromatic aberrations appearing in said first and second light beams and in reflected light of said first and second light beams, emergent from the surface of said wafer by an optical path controlling member disposed on a pupil plane of said projection optical system or on a plane located in the vicinity of said pupil plane.

43. A projection exposure method according to claim 33, said second step includes a step of shielding said third and fourth light beams transmitted by said reticle by a spatial filter member disposed on a pupil plane of said projection optical system or on a plane located in the vicinity of said pupil plane.

44. A projection exposure method according to claim 33, wherein said second step includes a step of deflecting, by two first rotary mirrors included in said first light-sending system, said first and second light beams on the basis of rotation of two reflective surfaces of said first two rotary mirrors, so as to scan said first and second light beams along said first and second scan straight lines, respectively, and a step of deflecting, by two second rotary mirrors included in said second light-sending system, said third and fourth light beams on the basis of rotation of two reflective surfaces of said second two rotary mirrors, so as to scan said third and fourth light beams along said third and fourth scan straight lines, respectively.

45. A projection exposure method according to claim 33, wherein said second step includes a step of outputting, by said first light-sending system, a first beam pair composed of two light beams having a first frequency difference is said first light beam, and making, by said first light-sending system, the two light beams constituting said first light beam pair intersect with each other in symmetry on said first scan straight line, thereby generating first interference fringes running along said first scan straight line, wherein said second step includes a step of outputting, by said first light-sending system, a second beam pair composed of two light beams having a second frequency difference as said second light beam, and making, by said first light-sending system, the two light beams constituting said second light beam pair intersect with each other in symmetry on said second scan straight line, thereby generating second interference fringes running along said second scan straight line, wherein said second step includes a step of outputting, by said second light-sending system, a third beam pair composed of two light beams having a third frequency difference as said third light beam, and making, by said second light-sending system, the two light beams constituting said third light beam pair intersect with each other in symmetry on said third scan straight line, thereby generating third interference fringes running along said third scan straight line, and wherein said second step includes a step of outputting, by said second light-sending system, a fourth beam pair composed of two light beams having a fourth frequency difference as said fourth light beam, and making, by said second light-sending system, the two light beams constituting said fourth light beam pair intersect with each other in symmetry on said fourth scan straight line, thereby generating fourth interference fringes running along said fourth scan straight line.

46. A projection exposure method according to claim 45, wherein said first step includes a step of setting, by said first light-sending system, two first intersecting points between the two light beams constituting said first light beam pair and a pupil plane of said projection optical system and two second intersecting points between the two light beams constituting said second light beam pair and the pupil plane of said projection optical system in axis symmetry with respect to an auxiliary reference straight line being parallel to said reference straight line and passing an intersecting point between the pupil plane of said projection optical system and the optical axis of said projection optical system.

47. A projection exposure method according to claim 46, wherein said first step includes a step of deviating, by said first light-sending system, a distribution of said two first intersecting points and said two second intersecting points along said auxiliary reference straight line with respect to the intersecting point between the surface of said wafer and the optical axis of said projection optical system.

48. A projection exposure method according to claim 45, wherein said first step includes a step of setting, by said second light-sending system, said third scan straight line as conjugate with said first scan straight line through said projection optical system, and a step of setting, by said second light-sending system, said fourth scan straight line as conjugate with said second scan straight line through said projection optical system.

49. A projection exposure method according to claim 45, wherein said second step includes a step of correcting chromatic aberrations appearing in said first and second light beam pairs and in reflected light of said first and second light beam pairs, emergent from the surface of said wafer by an optical path controlling member disposed on a pupil plane or said projection optical system or on a plane located in the vicinity of said pupil plane.

50. A projection exposure method according to claim 45, wherein said second step includes a step of shielding said third and fourth light beam pairs transmitted by said reticle by a spatial filter member disposed on a pupil plane of said projection optical system or on a plane located in the vicinity of said pupil plane.

51. A projection exposure method according to claim 45, wherein said third step includes a step of measuring, by said first light-receiving system, a phase difference between diffracted light of said first light beam pair emergent from said wafer mark and diffracted light of said third light beam pair emergent from said reticle mark, and a step of measuring, by said second light-receiving system, a phase difference between diffracted light of said second light beam pair emergent from said wafer mark and diffracted light of said fourth light beam pair emergent from said reticle mark.

* * * * *